United States Patent
Brophy et al.

(10) Patent No.: US 9,314,811 B1
(45) Date of Patent: Apr. 19, 2016

(54) COATING AND CURING APPARATUS AND METHODS

(71) Applicant: Enki Technology, Inc., San Jose, CA (US)

(72) Inventors: Brenor L. Brophy, San Jose, CA (US); Peter R. Gonsalves, Santa Clara, CA (US); Sina Maghsoodi, San Jose, CA (US); Thomas E. Colson, Sunnyvale, CA (US); Yu S. Yang, Pleasanton, CA (US); Ze'ev R. Abrams, Mountain View, CA (US)

(73) Assignee: Enki Technology, Inc., San Jose, CA (US)

( * ) Notice: Subject to any disclaimer, the term of this patent is extended or adjusted under 35 U.S.C. 154(b) by 0 days.

(21) Appl. No.: 14/709,031

(22) Filed: May 11, 2015

(51) Int. Cl.
*B05C 1/08* (2006.01)
*B05C 11/02* (2006.01)
*B05C 11/10* (2006.01)
*B05C 9/14* (2006.01)

(52) U.S. Cl.
CPC ... *B05C 9/14* (2013.01); *B05C 1/08* (2013.01); *B05C 1/083* (2013.01); *B05C 1/0817* (2013.01); *B05C 11/025* (2013.01); *B05C 11/1005* (2013.01)

(58) Field of Classification Search
None
See application file for complete search history.

(56) References Cited

U.S. PATENT DOCUMENTS

| | | | |
|---|---|---|---|
| 4,017,982 A | 4/1977 | Goffredo | |
| 4,185,399 A | 1/1980 | Gladish | |
| 4,608,941 A | 9/1986 | Morris | |
| 4,620,989 A | 11/1986 | Stiegler | |
| 4,821,674 A * | 4/1989 | deBoer et al. | 118/666 |
| 5,038,706 A | 8/1991 | Morris | |
| 5,306,560 A | 4/1994 | Wright et al. | |
| 5,510,141 A | 4/1996 | Makita et al. | |
| 5,641,544 A | 6/1997 | Melancon et al. | |
| 5,645,736 A | 7/1997 | Allman | |
| 5,863,330 A | 1/1999 | Alain Le Riche et al. | |
| 6,871,418 B2 | 3/2005 | Raychaudhuri et al. | |
| 7,037,878 B2 | 5/2006 | Liu et al. | |
| 7,247,350 B2 | 7/2007 | Sepeur et al. | |
| 8,668,960 B1 | 3/2014 | Hanumanthu et al. | |

(Continued)

FOREIGN PATENT DOCUMENTS

| | | |
|---|---|---|
| WO | 2014124178 A2 | 8/2014 |
| WO | 2014124178 A3 | 1/2015 |
| WO | 2014124178 A4 | 2/2015 |

OTHER PUBLICATIONS

Al-Dahoudi, "Wet Chemical Deposition of Transparent Conducting Coatings Made of Redispersable Crystalline ITO Nanoparticles on Glass and Polymeric Substrates", Dissertation (Saarland University), 2003, 170 pages.

Fujii, et al., "The sol-gel preparation and characterization of nanoporous silica membrane with controlled pore size", Journal of Membrane Science, 187 (2001), p. 171-180, 10 Pages.

(Continued)

*Primary Examiner* — Dah-Wei D Yuan
*Assistant Examiner* — Jethro M Pence
(74) *Attorney, Agent, or Firm* — GTC Law Group PC & Affiliates

(57) ABSTRACT

Disclosed is a coating apparatus including flow coating and roll-coating that may be used for uniform sol-gel coating of substrates such as glass, solar panels, windows or part of an electronic display. Also disclosed are methods for substrate preparation, flow coating and roll coating. Lastly, systems and methods for curing sol-gel coatings deposited onto the surface of glass substrates using high temperature air-knives, infrared emitters and direct heat applicators are disclosed.

21 Claims, 17 Drawing Sheets

(56) References Cited

U.S. PATENT DOCUMENTS

| | | | |
|---|---|---|---|
| 8,960,123 | B2 | 2/2015 | Brophy |
| 2002/0125821 | A1 | 9/2002 | Steckl et al. |
| 2002/0129764 | A1 | 9/2002 | Jacobson et al. |
| 2003/0200918 | A1 | 10/2003 | Nagashima et al. |
| 2011/0244136 | A1 | 10/2011 | Ryabova |
| 2012/0304926 | A1* | 12/2012 | Boguslavskiy et al. ....... 118/696 |
| 2014/0227507 | A1 | 8/2014 | Brophy et al. |
| 2015/0099060 | A1 | 4/2015 | Brophy et al. |

OTHER PUBLICATIONS

PCT/US2014/015167, "International Application Serial No. PCT/US2014/015167, International Search Report and Written Opinion mailed Nov. 19, 2014", Enki Technology Inc., 13 Pages.

PCT/US2014/015167, "International Application Serial No. PCT/US2014/015167, International Preliminary Report on Patentability and Written Opinion mailed Aug. 20, 2015", Enki Technology, Inc., 9 Pages.

European Application Serial No. 14749639.2, Supplementary European Search Report mailed Nov. 2, 2015, Enki Technology Inc., 4 Pages.

* cited by examiner

COATING AND CURING APPARATUS AND METHODS

STATEMENT REGARDING GOVERNMENT FUNDING

This invention was made with government support under Contract DE-EE0006810 awarded by the U.S. Department of Energy. The government has certain rights in the invention.

BACKGROUND

1. Field

The present disclosure relates generally to the field of thin-film sol-gel coatings and in particular to coating on substrates such as glass or solar panels.

2. Description of Related Art

Thin-film sol-gel coating refers to a technique of coating substrates, such as optical surfaces, windows, solar panel surfaces, and the like, using a wet chemical formulation called a 'sol' that undergoes a 'gelation' process wherein it polymerizes to form a solid thin-film on a substrate. These thin-films often undergo a subsequent curing step to increase mechanical strength and other properties. This curing is often accomplished by heating or irradiating the substrate and coating. Thin-film sol-gel coating is a very versatile process that has many industrial uses such as formation of dielectric layers on semiconductor wafers and water repellent layers on ceramics. There are several well documented techniques for applying wet sol to substrates, some of which are in widespread industry use and others that have generally been limited to the laboratory. Industrial scale sol-gel coating is most commonly performed by a dip, spray, aerosol deposition, spin, meniscus, slot-die or roller process. There are also several methods used to cure sol-gel thin films including baking in ovens, treatment with microwave, infrared or ultra-violet radiant energy, and exposure to flowing hot gases. These methods may or may not work in concert with components of the coating that catalyze or otherwise aid the curing process.

In the dip coating process the substrate to be coated is dipped into a tank containing the sol. It is then withdrawn at a process dependent speed. As the substrate is slowly drawn from the sol, the gelation process occurs just above the surface and a thin-film layer forms. Dip coating processes are inherently two sided in that all sides and edges of the substrate are coated. This can be advantageous if complete sol coverage is desired but is disadvantageous if the coating on some portion of the substrate interferes with a later substrate processing step. The dip coating technique requires a tank slightly larger than the substrate, which for large substrates means the tank may hold a large volume of sol. For sols mainly composed of organic solvents this may pose a vapor and flammability hazard. It may also be challenging to control the composition and quality of the sol within the large tank. Each new substrate dipped in the tank may carry contamination that is transferred to the sol; the sol might become depleted in some element as more substrates are processed causing a variation in the thin-film produced. The sol may change through evaporation of solvent at the surface where substrates are introduced.

Spray coating exists in many forms, but generally may be considered to be the deposition of material through a nozzle under pressure or the atomization of material which is then entrained by a jet of gas. In all cases the material is moved across a gap between a nozzle and a surface to be coated. The purpose of the spray system is to deposit a uniform layer of material over a wide area of the substrate. In the context of sol-gel coatings on substrates spray coating has the advantage of only applying fresh material to the substrate. Careful selection of solvents and control of solvent evaporation is needed to ensure that the correct final concentration of sol is delivered to the substrate. Spraying typically requires that either the nozzle or the substrate is moved in order to coat an area, for example the substrate may be moved past a line of stationary nozzles.

Spin coating is commonly used in the semiconductor wafer processing industry and in the LCD display panel industry to apply even layers of material to the surface of flat substrates such as silicon wafers or large pieces of glass. It has the same advantage as spray coating in that only fresh material is deposited. It also has excellent uniformity control. Generally, equipment to perform the spin coating tends to be complex and costly to maintain because of the fine mechanical control needed to achieve uniformity. This is particularly true as the size of the substrate increases.

Meniscus coating was historically used in the semiconductor industry before giving way to spin coating. It remains in use by some equipment vendors in the LCD display industry. Meniscus coating works by passing a substrate to be coated over a narrow slot at a very close distance such that material forced up through the slot forms a continuous meniscus with the substrate. As the substrate moves across the slot this meniscus deposits a layer of material on the substrate. The technique requires fine control over the distance between the slot and the substrate across the full length of the slot. Generally, the substrate must be extremely flat to avoid deviation in this distance. Additionally, this technique works best with viscous materials that can form a large meniscus. This limits its usability with sol-gel formulations that use comparatively low viscosity solvents.

Roll coating is a common application method for sol-gel coatings on flat substrates. In one embodiment of this process, material is deposited from a reservoir onto an application roller. A doctor blade or doctor roller may be used to control the thickness of the coating material placed on the application roller. That material is then transferred directly from the application roller to the substrate. In general, roll coating works best with continuous substrates, such as, for example, a roll of steel. In the case of discontinuous substrates such as pieces of glass or wood, for example, special techniques may be employed to control coating uniformity at the leading and trailing edges of the substrate. These techniques include, for example, varying the application roller contact pressure by having the coating roller touch-down on the leading edge and lift-off the trailing edge in a precisely controlled manner. The application roller may run in a forward direction, i.e. rolling with the substrate direction of movement or in a reverse direction, wherein the application roller opposes the direction of movement of the substrate. The surface of the application roller may be made of a compliant material that serves to compensate for any surface or flatness variations on the substrate and to provide a surface to which the coating material will adhere in a reasonably uniform manner, or the application roller may be a comparatively solid material. Depending on the rheology of the material to be coated, the surfaces of the rollers may be patterned with grooves or other textures to add in coating application.

Flow coating is a technique where coating material is flowed over a surface to be coated. The excess drips away and that which remains on the surface forms the final coating. The surface may be flat or irregular. In general, the substrate is oriented such that the coating material flows due to gravity. Advantages of this technique are its simplicity, ability to coat irregular surfaces, and the option to use only fresh material or to recirculate the excess material that drips off the surface.

It would also be preferable to enable drying and curing of such coatings at relatively low temperatures, such as below 150° C. so that the coatings could be applied and dried and cured on substrates to which other temperature sensitive materials had been previously attached, for example a fully assembled solar panel.

The curing process for sol-gel films is a separate process that occurs after the gelation of the sol-gel material. One common cure method is to heat a sol-gel coated article in an oven. This has the advantage of simplicity. The oven may be of the batch type wherein a batch of coated material is placed in an oven that is then sealed, and maintained for a period, then opened and the batch removed. While in the oven, the coater material may be subject to a varying temperature profile created by the oven's controller. Alternatively, the oven may be of the continuous type wherein a conveyor belt or similar transport mechanism moves coated articles through a heated container. As the material moves through the container it may experience different temperatures in different zones creating a temperature profile consisting of heating, soaking at a fixed temperature, then cooling. The profile may be a function of the temperature zones within the oven and the speed of the transport mechanism. Heat within the oven may be provided by convection with hot gases created by combustion of fuel gas or by the heating of gas by electrical elements. Alternatively, the coated article might be heated by radiant heat.

Some types of sol-gel coatings may be cured with ultraviolet radiation. In these types of materials, chemical crosslinking within the material is promoted by high-energy photons.

For the curing of thin coatings on surfaces, hot gasses may be passed directly over the thin-film to heat the surface layer by conduction.

Optimal methods for industrial scale sol-gel coating of flat substrates should be capable of selectively coating just one face of a substrate; be economical in their use of the coating material; provide easy compositional and contamination control; be versatile with respect to the sol-gel formulation such that solvents of different volatilities can be used and chemically compatible with critical equipment; be of low complexity and cost; capable of handling large imperfections in substrate surface flatness, and capable of achieving superior coating uniformity. Optimal curing methods should be cost effective; not damage the coated substrate; match the through-put of the prior coating process step and effectively cure the coating material to its final desired properties.

SUMMARY

In an aspect, a coating and curing apparatus may include a conveyor system of a combination roll coating and curing facility, wherein the combination roll coating and curing facility comprises at least one roll coating facility and at least one curing facility, and wherein the conveyor system is adapted to transport a substantially flat substrate through the combination roll coating and curing facility, a processor that controls a process parameter of the at least one roll coating facility, and an air knife of the at least one curing facility, wherein the air knife is adapted to direct heated air to a portion of the flat substrate as it is transported through the at least one curing facility, wherein the at least one roll coating facility is adapted to coat the substantially flat substrate with a sol gel coating material. The substantially flat substrate may be a part of at least a partially finished solar module. The apparatus may further include an electrical element disposed within the air stream to heat the air flowing through the air knife. The air may be heated to a temperature between about 300° C. and 1000° C. The apparatus may further include a fan in the air stream that directs air to the air-knife. The apparatus may further include an electronic controller that controls the temperature based on readings from at least one temperature sensor located in the air stream. The apparatus may further include an exhaust to remove heated air from the apparatus. The apparatus may further include a flat plate attached to the leading edge of the air-knife, wherein the flat plate is adapted to form a pre-heat chamber with the top surface of the substantially flat substrate. The apparatus may further include an infrared emitter disposed along the conveyor system prior to the air knife, wherein the infrared emitter is adapted to heat the substantially flat substrate to a temperature of between 25° C. to 200° C. The apparatus may further include an infrared emitter disposed along the conveyor system subsequent to the air knife, wherein the infrared emitter is adapted to maintain the flat substrate at a temperature of between 120° C. to 400° C. The process parameters may include at least one of a doctor roller spacing and/or pressure to an application roller, the application roller spacing or pressure taken with respect to the substantially flat substrate, a speed at which the substantially flat substrate is conveyed by the conveyor system, and in the case of reverse roll-coating, a difference in speed between the substantially flat substrate and the application surface of the application roller. The processor may further control a process parameter of the curing facility. A plurality of roll coating facilities and curing facilities may be arranged sequentially. The air-temperature exiting the air knife may be between 500° C. to 750° C. The speed of the substantially flat substrate on the conveyor system may be between 0.25 cm/s and 3.5 cm/s. The resulting temperature of a surface of the substantially flat substrate may be between 150° C. to 600° C.

In some embodiments, the curing facility includes at least one infrared emitter disposed along the conveyor system and no air-knife. The infrared emitter is adapted to heat the bulk of the substantially flat substrate to between about 200° C. to about 450° C., or to between about 250° C. and 350° C. The infrared emitter is further adapted to have peak emission at a wavelength of between about 2 µm and about 5 µm, or between about 2.5 µm and about 3.0 µm and an emitter temperature of between about 300° C. and about 1300° C., or between about 600° C. and about 900° C. The infrared emitter is further adapted to have an output energy flux of between about 1 W/cm$^2$ and 10 W/cm$^2$, or between about 2 W/cm$^2$ and about 4 W/cm$^2$. The heating duration may be between about 10 seconds and about 120 seconds, or between about 30 seconds and about 90 seconds. In some embodiments the speed of the substantially flat substrate is between about 3 cm/s and about 20 cm/s. In some embodiments the substantially flat substrate is tempered glass, in which case a consideration when curing the coating is not to adversely affect the temper by limiting the maximum temperature attained by the substantially flat substrate to less than about 300° C. for anything except durations shorter than about 180 seconds. In some embodiments infrared emitters are disposed both above and below the substantially flat substrate to heat both sides at the same time.

In some embodiments, the curing facility includes at least one heat applicator such as a roller or a plate that directly contacts the substantially flat substrate and heats the surface by direct conduction. The heat applicator may be composed of metals including iron, steel, stainless steel, aluminum, copper, brass and other alloys. The metal selected should exhibit at least one of good heat capacity, hardness and wear resistance, reasonable corrosion resistance, low cost and good machinability. The heat applicator may be a composite structure wherein a core of material, such as for example, copper or the like is encased in a secondary material to impart additional properties such as corrosion resistance or compliance, or enhanced wear resistance. The outer coating material may be a polymer engineered to withstand high temperatures, such as a silicone rubber or the like. The heat applicator may also include ceramic or refractory materials entirely or in part. The applicator may be heated using an electrical heating element incorporated into the applicator, or by passing a heated gas or liquid through one or more channels inside the applicator, or by direct heating on the outer surface of the applicator using electrical heating or direct heating by combustion of a fuel such as gas jets or the like. In an embodiment where the heat applicator is at least one roller, the heated roller may contact the coated surface of the substantially flat substrate and directly heats the coating by thermal conduction. In some embodiments, additional heated rollers may contact the coated surface of the substantially flat substrate sequentially such that each heated roller provides additional heating to raise the temperature of the coating to the desired value. In some embodiments, additional heated rollers may contact the uncoated or opposite side of the substantially flat substrate to provide additional heating or to reduce thermally induced stress. In some embodiments, the heat applicator may be a flat plate. The plate may directly contact the substantially flat substrate and heat the coating by thermal conduction or may be placed in close proximity of about 0 mm to about 10 mm to the coated surface of the substantially flat substrate wherein it heats a thin layer of air by conduction that subsequently heats the coating. In some embodiments the substantially flat substrate is in continual motion wherein the heated flat plate makes contact with the substrate and thereafter moves with it for the duration of the heating period. In other embodiments, the substantially flat substrate is moved into a stationary position where it can be contacted by the heated flat plate for the heating period, where thereafter the heated plate is removed and the substantially flat substrate is moved to the subsequent step. The temperature of the flat plate, the intimacy of the contact to the coated surface and the duration of the contact may all be used separately or in any combination to control the final temperature attained by the coated surface. The intimacy of the contact may be controlled by the degree of smoothness of the substantially flat substrate and the heated plate, the pressure exerted between the surfaces of the substantially flat substrate and the heated plate and the degree of compliance of the heated plate surface. The surface temperature of the heat applicator may be between about 400° C. and 1300° C. In embodiments with a heated plate, the duration of contact between the heated plate and the substantially flat substrate may be between about 1 second and 60 seconds.

In an aspect, a method of coating and curing may include conveying a substantially flat substrate to be coated with a conveyor system through a combination roll coating and curing facility, wherein the combination roll coating and curing facility comprises at least one roll coating facility and at least one curing facility, roll coating the substantially flat substrate with a sol gel coating material with the at least one roll coating facility, and curing the sol gel coating material on the substantially flat substrate with at least one of an air knife, infrared emitter, and heat applicator or combination thereof, wherein the air knife is adapted to direct heated air to, and/or wherein the infrared emitter directs radiation to, and/or wherein the heat applicator directly or closely contacts a portion of the substantially flat substrate as it is transported through the curing facility by the conveyor system. A sol-gel coated substantially flat substrate may be formed by the method, wherein a portion of the sol-gel coating material is cured while a different portion of the sol-gel coating material remains uncured.

In an aspect, a method of tuning the performance of a sol gel coating may include determining a desired cure temperature profile to achieve a specific performance metric for a sol gel coating using at least one physical analysis method, selecting settings for the curing system's operating parameters to achieve the desired temperature profiles for the sol gel coating on a substantially flat substrate, and curing the sol-gel coating on the substantially flat substrate with the curing system. The at least one physical analysis method may include at least one of thermogravimetric analysis, Fourier transform infrared spectroscopy, ellipsometry, nanoindentation, abrasion testing, spectrophotometry, and a water contact angle measurement. The curing system operating parameters may include at least one of substrate speed, air knife air-flow volume, air knife output air temperature, air knife opening distance to substrate surface, a temperature set-point for a pre-heating zone, a temperature set point for a post heating zone, a power setting for the infrared emitter, infrared emitter distance to the substrate, a temperature set-point for a heat applicator, and a contact time for a heat applicator. The performance metric for the sol-gel coating may include at least one of hardness, abrasion resistance, surface energy, refractive index, optical transmission, thickness and porosity. The method may further include a step of coating the substantially flat substrate with the sol gel coating using a roll-coating system before the step of curing. A sol-gel coated substantially flat substrate may be formed by the method. The specific performance metric may include a hardness of the sol-gel coating within a range of 0.2 GPa to 10 GPa. The specific performance metric may include a test in which no more than 1% of absolute optical transmission is lost after at least 500 strokes of an abrasion test performed in accordance with specification EN1096-2. The specific performance metric may include a water contact angle where the water contact angle is within 60° to 120°. The specific performance metric may include a water contact angle where the water contact angle is within 5° to 30°. The specific performance metric may include a refractive index of the cured, coated sol gel from 1.25 to 1.45. The thickness may be approximately 50 nm to 150 nm. A sacrificial component of the sol-gel coating may be volatilized to form a desired porosity.

In an embodiment, a coating and curing apparatus may include a conveyor system of a combination roll coating and curing facility, wherein the combination roll coating and curing facility comprises at least one roll coating facility followed by at least one curing facility, the at least one roll coating facility comprising a doctor roller and an application roller, and wherein the conveyor system is adapted to transport a substantially flat substrate first through the at least one roll coating facility and afterwards through the at least one curing facility, a source of a sol-gel coating for use in the combination roll coating and curing facility, the source comprising space for a reservoir of the sol-gel coating material between the doctor roller and the application roller of the at least one roll coating facility, the reservoir in fluid communication with the doctor roller and the application roller, a processor that controls a process parameter of the at least one roll coating facility, and an at least one infrared emitter of the at least one curing facility, wherein the at least one infrared emitter is adapted to direct radiation to a portion of the flat substrate as it is transported through the at least one curing facility, wherein the at least one roll coating facility is adapted to coat the substantially flat substrate with a continuous film of sol gel coating material and wherein the at least one infrared emitter is adapted to cure the continuous sol gel coating material. The conveyor system may be configured for coating a solar module or glass. The at least one infrared emitter is heated to a temperature between about 300° C. and about 1300° C., outputs an energy flux of between about 1 W/cm$^2$ and about 10 W/cm$^2$, and has a peak emission wavelength between about 2 μm and about 5 μm. The conveyor system conveys the substantially flat substrate at a speed between about 3 cm/s and about 20 cm/s. The curing facility is configured to heat a surface of the substantially flat substrate to between about 200° C. and about 350° C. The substantially flat substrate is heated within the curing facility for between about 10 seconds and about 120 seconds. The infrared emitter is heated by combustion of a pre-mixed air/fuel gas. The infrared emitter is a pipe burner, a porous refractory plate, or an electrical element. The output power of the infrared emitter is controlled by an electronic circuit by means of feedback from a sensor that measures the surface temperature of the substantially flat substrate. The sensor may be a pyrometer. The curing facility includes a plurality of infrared emitters disposed to direct radiation at the substantially flat substrate. The plurality of infrared emitters are disposed to direct radiation to both top and bottom surfaces of the substantially flat substrate. The curing facility has one or more zones distinguished by differing heating capacities. The curing facility has a heat-up zone that heats up the substantially flat substrate, a dwell zone that maintains a temperature of a hot substantially flat substrate, and a cool-down zone that allows the temperature of the hot substantially flat substrate to reduce. A plurality of roll coating facilities and curing facilities may be arranged sequentially.

These and other systems, methods, objects, features, and advantages of the present disclosure will be apparent to those skilled in the art from the following detailed description of the preferred embodiment and the drawings.

All documents mentioned herein are hereby incorporated in their entirety by reference. References to items in the singular should be understood to include items in the plural, and vice versa, unless explicitly stated otherwise or clear from the text. Grammatical conjunctions are intended to express any and all disjunctive and conjunctive combinations of conjoined clauses, sentences, words, and the like, unless otherwise stated or clear from the context.

BRIEF DESCRIPTION OF THE DRAWINGS

The disclosure and the following detailed description of certain embodiments thereof may be understood by reference to the following figures.

DETAILED DESCRIPTION

Various embodiments of the disclosure are described below in conjunction with the Figures; however, this description should not be viewed as limiting the scope of the present disclosure. Rather, it should be considered as exemplary of various embodiments that fall within the scope of the present disclosure as defined by the claims. Further, it should also be appreciated that references to "the disclosure" or "the present disclosure" should not be construed as meaning that the description is directed to only one embodiment or that every embodiment must contain a given feature described in connection with a particular embodiment or described in connection with the use of such phrases. In fact, various embodiments with common and differing features are described herein.

Figure 1:
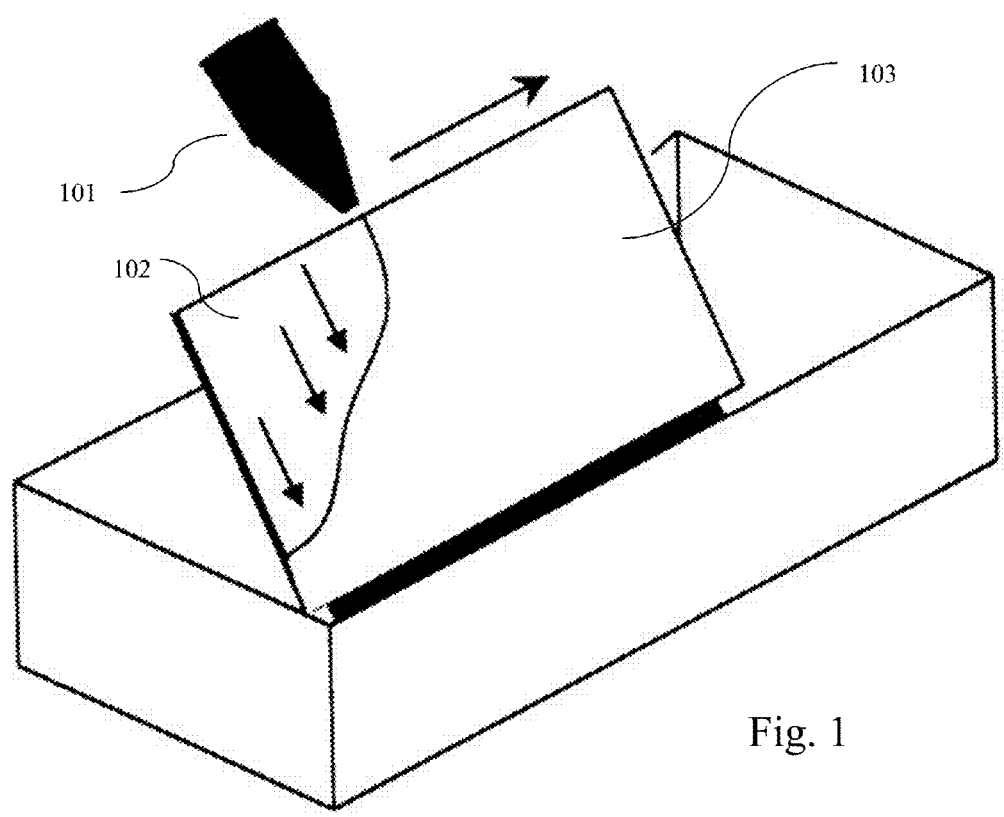
FIG. 1 depicts an embodiment of flow coating.

FIG. 1 depicts an embodiment of laboratory scale flow coating. In embodiments, a nozzle (101) dispenses a material (102) onto an inclined substrate (103) as it is moved across the top edge of the substrate. The material flows down the substrate, and the excess drips from the bottom edge of the substrate. The material that remains adhered to the substrate undergoes a gelation process as it dries and forms a thin-film coating on the substrate.

While the basic laboratory system shown in FIG. 1 can be scaled up in substrate size, its rate of coating may be slow and wasteful of coating material. It is possible to recover the coating material that drips off the bottom edge and recycle it to the nozzle, but this makes control of composition and contamination of the recycled material difficult. What is needed is a flow coating system that has a fast coating rate and that is economical with coating material with minimal wastage dripping from the bottom edge, without recycling of this material.

Figure 2:
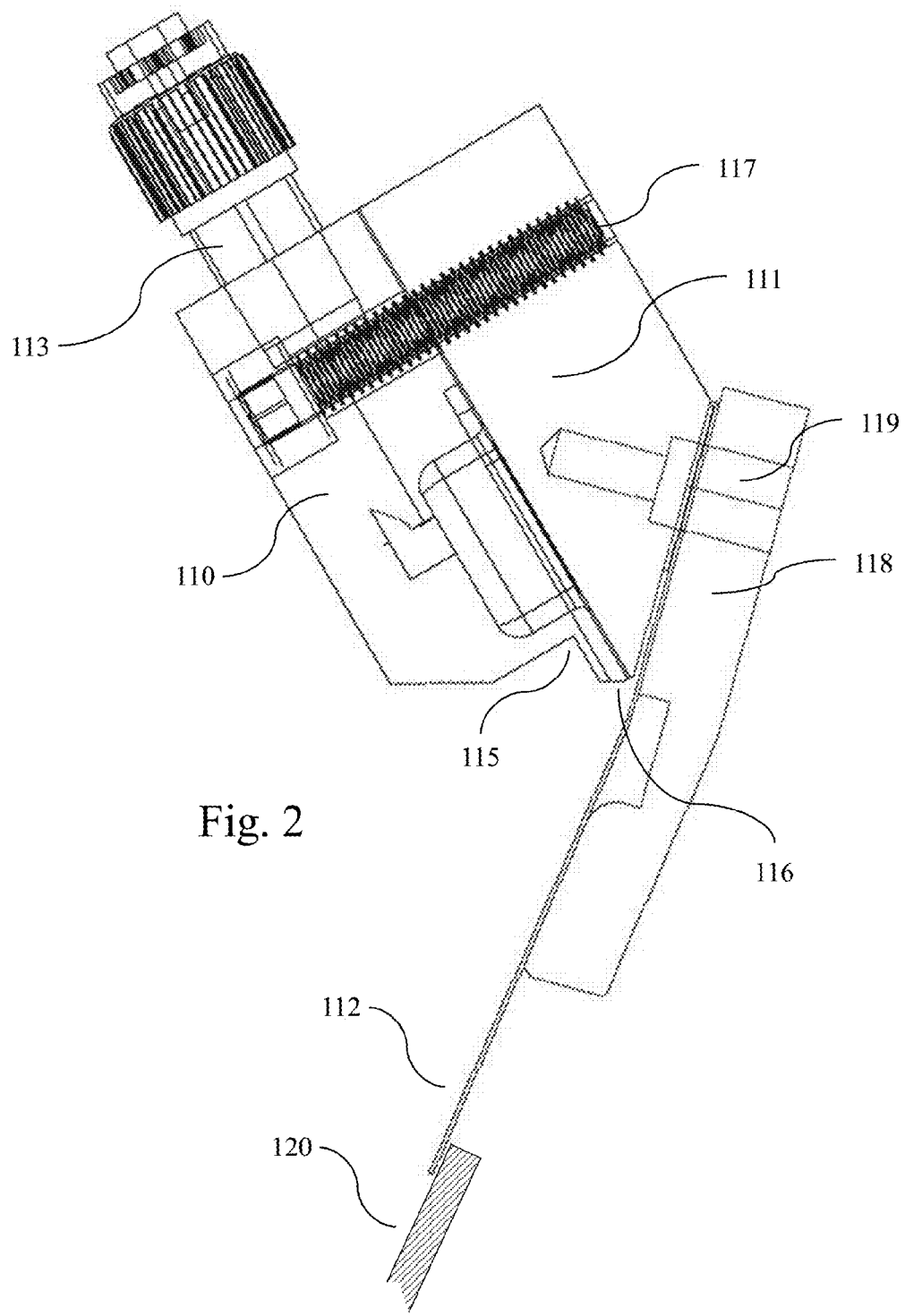
FIG. 2 depicts a cross-sectional view of an embodiment of a flow coating head.
Figure 5:
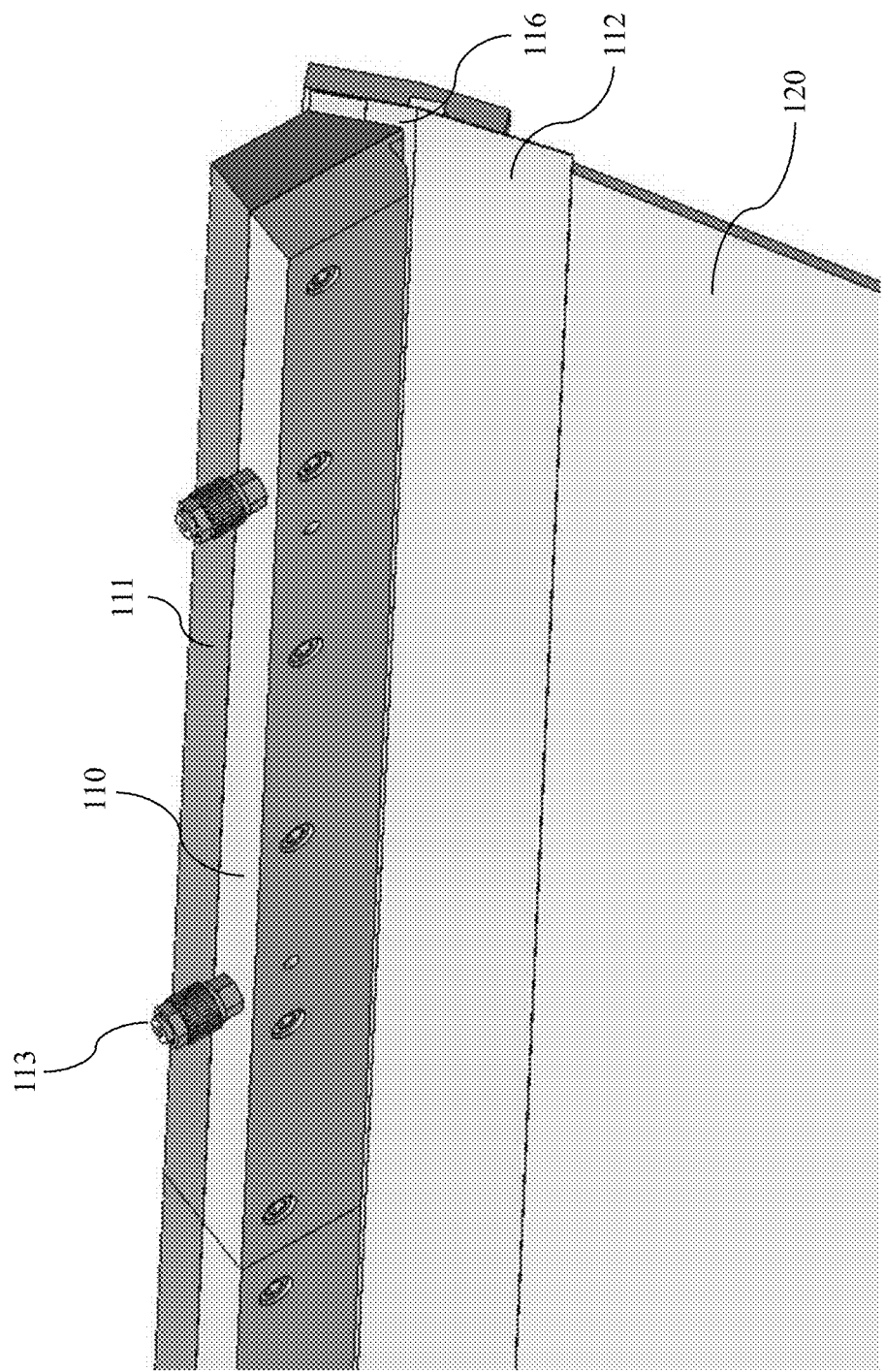
FIG. 5 depicts a partial view of the assembled flow coating head of FIG. 2 and a corresponding substrate.

In one embodiment, a coating head such as the one shown in FIG. 5 and in cross-section in FIG. 2 may be used in flow coating. The coating head includes a long slot (116) formed between a lower slot manifold (110) and an upper slot manifold (111). This slot is positioned parallel to and extends along the length of the top edge of an inclined substrate (120). In an embodiment, the slot is approximately as long as the edge of the substrate to be coated. For example, the slot may be oriented along the longer edge of a rectangular substrate, such that the fluid flows down the substrate along its shorter edge. This orientation minimizes the time required for gravity to carry the fluid across the entire area of the substrate. In an embodiment, a distribution blade (112) bridges the gap between the slot and the top edge of the substrate such that coating material flowing out of the slot is deposited on to the distribution blade and then flows under gravity to the bottom of the distribution blade, which contacts the front surface of the substrate just below the top edge of the substrate. The coating material then flows off the distribution blade onto the front surface of the substrate and from there down the substrate until eventually it either drips from the bottom edge or is removed by other means. The length of the distribution blade is slightly longer than the length of the slot and of the edge of the substrate that is being coated. In an embodiment, the distribution blade extends beyond each end of the slot manifold assemblies. For example, the distribution blade may extend 2-100 mm beyond each end of the slot manifold assemblies. In another example, the distribution blade may extend 10 mm beyond the substrate.

Figure 4:
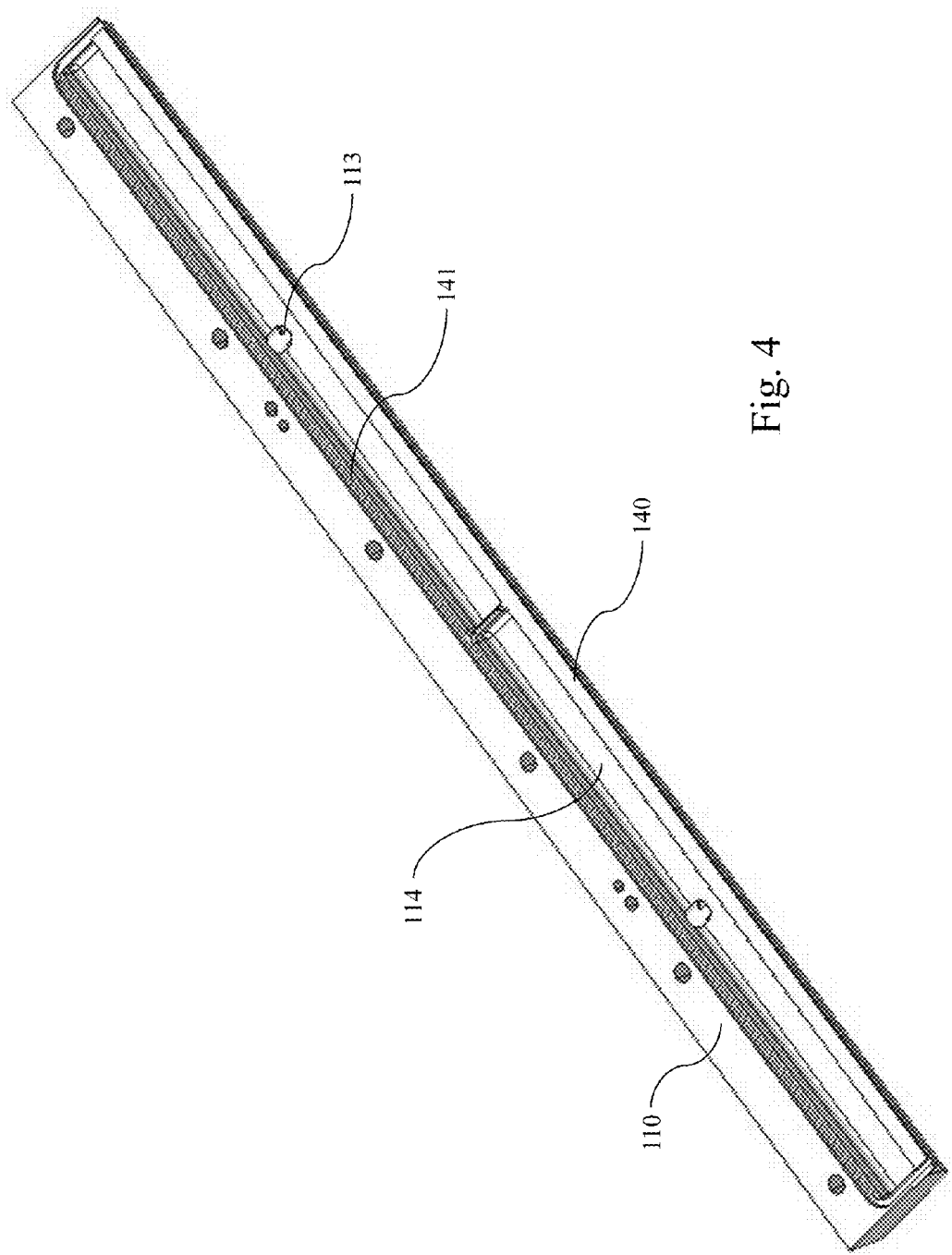
FIG. 4 depicts an isometric view of a flow coating head lower slot manifold.

Coating material is supplied to the slot by a dispensing system, such as a pump (not shown) capable of transferring the liquid coating material, and that is also capable of delivering a measured quantity of coating material through one or more inlet ports (113) in the lower slot manifold. The inlet port directs material into a corresponding internal pocket (114) within the lower slot manifold that allows the coating material to accumulate below the lip of the slot and to spread evenly along the slot before it begins to overflow the slot and flow onto the distribution blade, providing a uniform fluid front of material over the blade. FIG. 4 shows an isometric view of the internal detail of a lower slot manifold (110). The coating material flows from the port inlet, located in the middle of the internal pocket, outwards toward the ends of the internal pocket and so is distributed evenly along the back side of the slot lip (140). Once enough material has filled the internal pocket it will begin to overflow the slot lip evenly along the length of the slot. The upper slot manifold (not shown in FIG. 4) forms the opposing side of the slot. A seal channel (141) may allow the assembly to close to the appropriate slot width, as is described herein.

Figure 6:
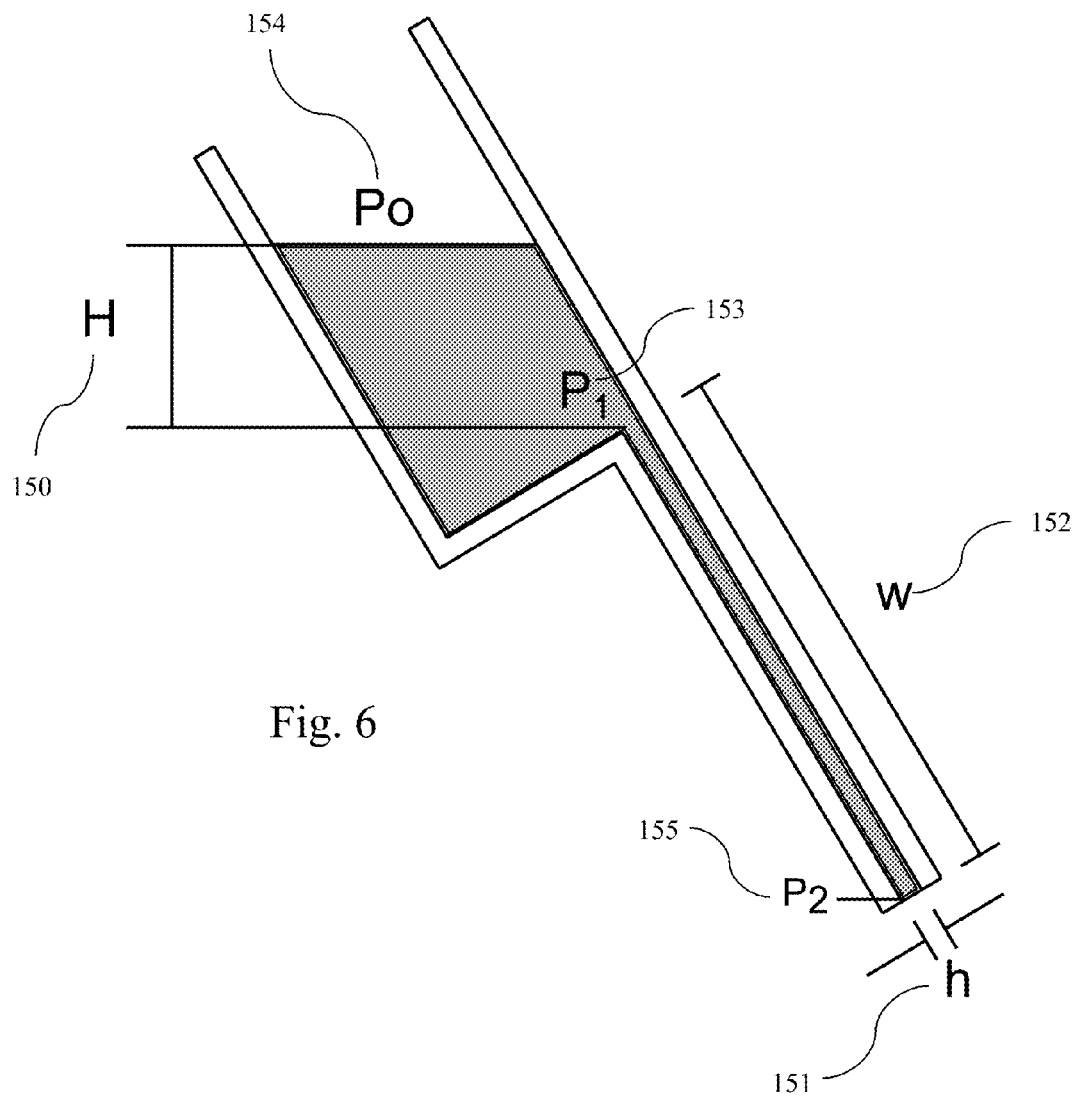
FIG. 6 shows a schematic cross-sectional view of a coating slot identifying several critical dimensions and parameters.

Producing high quality coatings of uniform thickness onto the substrate may depend on the rate at which the fluid flows through the slot. In turn, the rate at which the material flows may be highly dependent upon several factors of the design including the slot length (l), width (w) (152) and height (h) (151), as seen in FIG. 6, the viscosity ($\mu$) and density ($\rho$) of the coating material, and the pressure differential ($\Delta P$) over the width of the slot. In an embodiment, the fluid flow in the slot is both laminar and has a fully developed velocity profile upon exit onto the distribution blade. Laminar flow in the slot can be achieved by ensuring the fluid has a Reynolds number less than 1,400. In an embodiment, the Reynolds number ($R_e$) of the coating fluid within the slot is less than 100. The coating fluid may exit the slot with a velocity profile that is independent of subtle edge effects, turbulence and other disturbances present at the coating fluid's entry into the slot. This condition can be achieved by ensuring the width of the slot is significantly longer than the flow's characteristic entrance length ($L_e$). In an embodiment, the slot width is equal to at least 10 times the entrance length. Such a condition is governed in the following relation, which uses the Blasius approximation to solve for the entrance length between parallel surfaces:

$$L_e = \frac{hRe_h}{100}$$

The volumetric rate at which the coating fluid flows through the slot is closely approximated by the following relation:

$$Q = \frac{l\Delta Ph^3}{12w\mu}$$

With average flow speed, V, determined by:

$$V = \frac{Q}{lh}$$

In an embodiment, sol coating flow rates per unit slot length of between $5\times10^{-9}$ and $5\times10^{-4}$ m$^2$/s are useful for coating glass substrates of high quality, and uniform thickness. In an embodiment with a 2 meter long slot, this equates to a volumetric flow rate between $1\times10^{-7}$ and $1\times10^{-3}$ m$^3$/s. To prevent splatter or turbulent flow or other undesirable phenomena from impacting the distribution blade or substrate, coating material may not be forced from the slot under high pressure or flow rates. For example, gravity force may be used to drive fluid from the internal pocket to the distribution blade. In an embodiment, the slot is designed such that for the chosen coating material properties, the flow rate out of the slot is less than the flow rate into the internal pocket. This has the effect of building a reservoir of coating material behind the slot in the internal pocket, forcing it to spread evenly under the influence of gravity along the entire length of the slot and to build up a head height H (150), as in FIG. 6, inside the internal pocket. If the flow rate through the slot is too high, then coating material will completely flow through part of the slot before spreading along the entire length of the slot and reaching the ends furthest away from the inlet port. If the flow rate is too low, then the internal pocket may completely fill with coating material causing an increase in pressure that will create uneven flow rates and excessive back pressure on the coating fluid, and adversely affect the flow rate through the slot. All of these issues can cause the slot flow rate to vary and can affect the quality and uniformity of the coating. The pressure drop over the slot width, $\Delta P$, can be related the fluid head height within the interior pocket, H (150), the internal pocket pressure $P_o$ (154), pressure at the entrance to the narrow slot, $P_1$ (153), and the pressure at the exit of the slot, $P_2$ (155), the fluid material density $\rho$ and the gravitational constant g according to the following relationship:

$$\Delta P = P_1 - P_2$$

$$\Delta P = \rho g H + P_o$$

This pressure input as a function of head height, combined with the desired flow rate drives the desired slot height, h (151). As a result, careful consideration should be paid to the pressure in the internal pocket. Some embodiments keep the internal pocket sealed via a gasket, o-ring or sealant such that pressure is controlled by the relative flow rates of coating material into and out of the pocket. Other embodiments may include vents between the internal pocket and ambient pressure or to an auxiliary pressurization system. In an embodiment, pressure inside the pocket is vented to the atmosphere and slot height, h, is determined by the following relationship:

$$h = \sqrt[3]{\frac{12Qw\mu}{l\rho gH}}$$

Given the above parameters, for a typical sol coating, the width of the slot is between 0.05 and 2 mm, and preferably 0.1 to 0.5 mm. This width may be controlled by placing shims between the upper and lower slot manifolds. Alternative embodiments may use machined steps or other gap control methods. The assembly of upper and lower slot manifolds may have a gasket-like seal along the top and sides to ensure material is directed towards the slot. An O-ring or similar internal pocket seal may allow the assembly to close to the appropriate slot width, and may be facilitated with the use of a seal channel (141).

The distribution blade may serve at least three functions in enabling consistent and uniform coating thickness; 1) it provides a path for coating material to flow from the slot to the substrate; 2) it has a high energy surface that causes the material to spread evenly by surface tension during its travel from the slot to the substrate; and 3) it provides an interface to the substrate surface that is tolerant of imperfections in flatness or warping of the substrate. In one embodiment, the distribution blade is relatively more flexible than the substrate and is able to conform to an uneven or warped substrate. For example, the distribution blade is 316L stainless steel, 2020 mm long, 45 mm wide and 0.38 mm thick and the substrate is tempered soda-lime glass 1970 mm long, 984 mm wide and 3.2 mm thick. In another embodiment, the distribution blade is relatively more rigid than the substrate and a mechanism clamps the substrate to the back surface such that it is held flat against the distribution blade. In one embodiment, the distribution blade has a surface energy between 25 mN/m and 100 mN/m.

The coating material exiting the head slot may not naturally form a continuous curtain or 'waterfall' of coating material in the absence of the distribution blade, and instead, the coating material may exit the slot with many drips or small rivulets of material all along the length of the slot which may not result in a consistent or uniform thickness coating on the substrate. To achieve a curtain or "waterfall" out of the slot head in the absence of the distribution blade would require significantly greater flow rates of coating material, and could therefore result in significant waste of coating material. Thus, the distribution blade enables a consistent and uniform thickness coating with minimal material waste.

In FIG. 2, the distribution blade is a thin piece of material that is held in place by a backing plate (118) that along with the distribution blade is attached to the upper slot manifold (111) by a plurality of bolts or other fastening means (119). This backing plate also serves to tension the distribution blade by forcing it forward at a slight angle. This reduces warping of the thin distribution blade along its length. The upper and lower slot manifolds are held together by a plurality of bolts or other fastening means (117). In some embodiments the bottom edge of the thin distribution blade may be beveled or rounded. In a preferred embodiment it is beveled between 15° and 60°.

In some embodiments the distribution blade is made from a stainless steel alloy such as 316L. In other embodiments it could be made from titanium, chrome or nickel plated steel, various corrosion resistant alloys, glass, ceramics, polymer or composite materials such as a metal coated polymer. The material may be chosen to be chemically resistant to the composition of the coating material such that it is not damaged by the coating material and such that it does not contaminate the coating material in any way.

In FIG. 2, the lower slot manifold has a notch (115) just below the slot. The purpose of this notch is to prevent the flow of coating material from the slot along the bottom edge of the lower slot manifold and from there dripping on to the distribution blade or the substrate.

Figure 3:
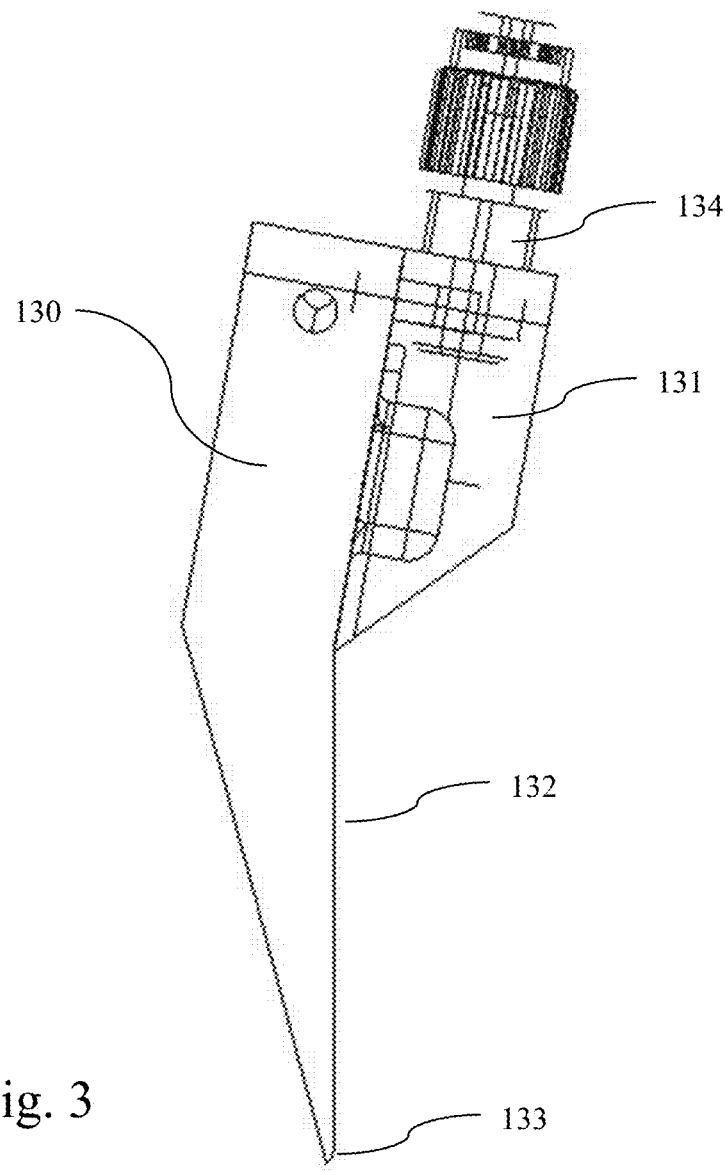
FIG. 3 depicts a cross-sectional view of a second embodiment of a flow coating head.

FIG. 3 shows an alternative embodiment of a distribution blade (130) wherein the blade is a solid piece of material that also forms the upper slot manifold. The front surface of the blade (132) acts to distribute the coating material evenly from the slot to the substrate. The bottom edge of the blade is profiled (133) to facilitate the flow of coating material from the blade onto the substrate. It should be understood that the exact shape of this profile can include curved or angled flat bevels and that the transition of angle from the face of the distribution blade can range from gradual to abrupt and that the final angle that the edge makes with the substrate surface can be from 10° (sharp) to 110° degrees (obtuse). In another embodiment, the thick or solid distribution blade does not also form the upper slot manifold, but is instead a separate piece that is bolted onto the slot manifold in a manner similar to the thin distribution blade shown in FIG. 2.

Some embodiments of the distribution blade include coatings or surface treatments on the front side (that is the wet side) and on the back side. For example, a front side surface treatment may enhance the spreading of the coating material as it flows to the substrate. A backside treatment might repel the coating material to suppress material gathering on the backside due to capillary action that then dripped onto the substrate as it was removed from the distribution or gather on the backside and contaminate the next substrate positioned against the blade. Other embodiments of the distribution blade include laminates and composites where dissimilar materials are fused or assembled together to provide differences between the front and backside surface properties as might also be achieved in the case of a coated metal blade.

Some embodiments of the coating head manifolds may have coatings or surface treatments to protect them from adverse chemical reactions with the coating material or to change how the coating material flows within the internal pocket or over the slot lip.

A full coating head may be composed of a plurality of slot manifold assemblies. For example each slot manifold assembly might be 50 cm long. Four such assemblies may be mounted on a supporting structure such that they form a 200 cm long coating head. The dimensions of the slot manifold assembly and the number of such assemblies used for a particular length of coating head may be selected to manage the cost of manufacturing the slot manifolds themselves and the complexity of constructing the coating head from multiple slot manifold assemblies. In the case where multiple slot manifold assemblies are used to assemble a coating head, it is advantageous to have a single distribution blade that is continuous over the entire length of the coating head. However, multiple adjacent or overlapping segments of distribution blade comprising the length of the coating head are not precluded.

It should be understood that the number of internal pockets and inlet ports within a slot manifold is variable and may be more or less than the two shown in FIG. 4. The number of pockets and inlet ports may be selected to manage the manufacturing complexity of the slot manifold and the uniformity of flow of coating material from the slot.

In the slot manifold, the wall between internal pockets may be kept as thin as possible. This wall affects the flow of material over the slot lip in its immediate vicinity. By keeping the wall as thin as is practical, the effect is minimized.

The method of coating using the apparatus may include the following steps. First, optionally, the substrate may be prepared for the coating by increasing the surface energy of the surface to be coated, thus making it possible for the coating material to spread evenly on the substrate surface by surface tension. In one embodiment, the substrate is glass and the surface energy is increased by washing vigorously with water and/or mechanical brushes. In other embodiments, the substrate surface may be prepared using gas plasma such as oxygen or by treatment with a gas flame. Other pre-treatments are described further herein.

As an initial step, the substrate is pre-treated or pre-cleaned to remove surface impurities and to activate the surface by generating a fresh surface or new binding sites on the surface. The substrate pre-treatment steps may provide uniform spreading and deposition of the sol, effective bonding interactions between the substrate and coating material for Si—O—Si linkage formation, and prevention of defects and imperfections at the coating-substrate interface because of uneven spreading and/or diminished bonding interactions due to surface inhomogeneities.

In particular, it is desirable to increase the surface energy of the substrate through pre-treatment or cleaning of the substrate surface to form an "activated" surface. For example an activated surface may be one with many exposed Si—OH moieties. An activated surface reduces the contact angle of the sol and enables effective wetting of the sol on the surface. In some embodiments, a combination of physical polishing or cleaning and/or chemical etching is sufficient to provide even wetting of the sol. In cases, where the surface tension would need to be further lowered, the substrate, such as glass, may be pretreated with a dilute surfactant solution (low molecular weight surfactants such as surfynol; long chain alcohols such as hexanol or octanol; low molecular weight ethylene oxide or propylene oxide; or a commercial dishwasher detergent such as CASCADE, FINISH, or ELECTRASOL to further help the sol spread better on the glass surface.

Accordingly, surface preparation may involve a combination of chemical and physical treatment of the surface. The chemical treatment steps may include (1) cleaning the surface with a solvent or combination of solvents, detergents, mild bases like sodium carbonate or ammonium carbonate (2) cleaning the surface with a solvent along with an abrasive pad, (3) optionally chemically etching the surface, and (4) washing the surface with water. The physical treatment steps may include (1) cleaning the surface with a solvent or combination of solvents, (2) cleaning the surface with a solvent along with particulate abrasives, and (3) washing the surface with water. It should be appreciated that a substrate can be pre-treated by using only the chemical treatment steps or only the physical treatment steps. Alternatively, both chemical and physical treatment steps could be used in any combination. It should be further appreciated that the physical cleaning action of friction between a cleaning brush or pad and the surface may be an important aspect of the surface preparation.

In the first chemical treatment step, the surface is treated with a solvent or combination of solvents with variable hydrophobicity. Typical solvents used are water, ethanol, isopropanol, acetone, and methyl ethyl ketone. A commercial glass cleaner (e.g., WINDEX) can also be employed for this purposes. The surface may be treated with an individual solvent separately or by using a mixture of solvents. In the second step, an abrasive pad (e.g., SCOTCHBRITE) is rubbed over the surface with the use of a solvent, noting that this may be performed in conjunction with the first step or separately after the first step. In the last step, the surface is washed or rinsed with water.

One example of substrate preparation by this method involves cleaning the surface with an organic solvent such as ethanol, isopropanol, or acetone to remove organic surface impurities, dirt, dust, and/or grease (with or without an abrasive pad) followed by cleaning the surface with water. Another example involves cleaning the surface with methyl ethyl ketone (with or without an abrasive pad) followed by washing the surface with water. Another example is based on using a 1:1 mixture of ethanol and acetone to remove organic impurities followed by washing the surface with water.

In some instances an additional, optional step of chemically etching the surface by means of concentrated nitric acid, sulfuric acid, or piranha solution (1:1 mixture of 96% sulfuric acid and 30% $H_2O_2$) may be necessary to make the surface suitable for bonding to the deposited sol. Typically this step would be performed prior the last step of rinsing the surface with water. In one embodiment, the substrate may be placed in piranha solution for 20 minutes followed by soaking in deionized water for 5 minutes. The substrate may then be transferred to another container holding fresh deionized water and soaked for another 5 minutes. Finally, the substrate is rinsed with deionized water and air-dried.

The substrate may alternatively or additionally be prepared by physical treatment. In the physical treatment case, the surface may simply be cleaned with a solvent and the mechanical action of a cleaning brush or pad, optionally a surfactant or detergent can be added to the solvent, after which the substrate is rinsed with water and air dried. In another embodiment, the surface is first cleaned with water followed by addition of powdered abrasive particles such as ceria, titania, zirconia, alumina, aluminum silicate, silica, magnesium hydroxide, aluminum hydroxide particles, silicon carbide, or combinations thereof onto the surface of the substrate to form a slurry or paste on the surface. The abrasive media can be in the form a powder or it can be in the form of slurry, dispersion, suspension, emulsion, or paste. The particle size of the abrasives can vary from 0.1 to 10 microns and in some embodiments from 1 to 5 microns. The substrate may be polished with the abrasive slurry via rubbing with a pad (e.g., a SCOTCHBRITE pad), a cloth, a foam, or paper pad. Alternatively, the substrate may be polished by placement on the rotating disc of a polisher followed by application of abrasive slurry on the surface and rubbing with a pad as the substrate rotates on the disc. Another alternative method involves use of an electronic polisher that can be used as a rubbing pad in combination with abrasive slurry to polish the surface. The substrates polished with the slurry are cleaned by pressurized water jet and air-dried.

Next, the substrate to be coated may be positioned with its top edge aligned with and parallel to the bottom edge of the distribution blade. The bottom edge of the distribution blade may overlap slightly with the top edge of the substrate. The amount of overlap is dependent upon the coating requirements but may be at least 0.1 mm and in a preferred embodiment be approximately 3 mm. The ends of the distribution blade may extend slightly beyond the left and right edges of the substrate, between 2 and 100 mm on each side. In an embodiment, it extends by 10 mm on each side. The substrate may be inclined at an angle of 60° to 85° relative to horizontal. In the case of a flexible thin distribution blade, the angle between the surface of the substrate and the surface of the distribution blade may be between 0° and 5°. The substrate can be pushed slightly against the distribution blade to apply pressure to the contact area such that the distribution blade conforms to any gross irregularity or deviation from flatness of the substrate. In the case of a rigid distribution blade, the substrate may be positioned with its front surface parallel to the back surface of the distribution blade and a clamping mechanism may hold the substrate to the distribution blade such that any warping or deviation from flatness of the substrate is eliminated against the flat back side of the distribution blade. In one embodiment, the coating head is stationary and the substrate is brought to it. However, in other embodiments, the substrate may be stationary and the coating head moved to position or both elements may move together to arrive at the final coating position. It is also possible for both elements to be stationary relative to each other but to be moving relative to the larger coating system.

Next, the front surface of the substrate may be completely wetted with a pre-wet solution. This pre-wet solution is dispensed in a manner that quickly wets the entire substrate surface rapidly, such as in less than 30 seconds. In one embodiment, a plurality of fan nozzles positioned on a rotatable mechanism above and in front of the substrate and along its length aligned to the coating head starts spraying pre-wet solution such that it first wets the distribution blade along it entire length. Then the nozzle assembly rotates such that the fan shaped jets of pre-wet solution from the nozzles travel down the substrate from its top edge to its bottom edge and in the process deposit pre-wet solution on the full surface of the distribution blade and the substrate. When employed, the pre-wet step decreases the time for the coating material to completely wet the substrate to between 1 and 25 seconds; improves the uniformity of distribution of the coating material on the substrate to ±25% by volume per unit area and reduces the amount of coating material needed to completely coat the substrate by up to 90%. The composition of the pre-wet solution is chosen to provide a number of properties: The viscosity is within ±50% of the viscosity of the coating material and more preferably within ±10% and even more preferably within ±2% and/or the surface tension is within ±50% of the surface tension of the coating material and more preferably within ±10% and even more preferably within ±2% and/or the vapor pressure is within ±50% of the vapor pressure of the coating material and more preferably within ±10% and even more preferably within ±2%. In one embodiment, the pre-wet solution comprises the same mixture of solvents, mixed in the same ratios as the coating material. For example, the pre-wet solution might be composed of 90% isopropyl alcohol and 10% water that approximately matches the ratio of isopropyl alcohol and water in a sol-gel coating material. In an alternative embodiment, the pre-wet solution could be a non-ionic, cationic or anionic surfactant, such as for example Sodium dodecyl sulfate or perfluoroalkyl sulfonate.

Next or some time shortly after the pre-wet step has commenced, a pre-determined amount of coating material may be dispensed from the coating head on to the substrate. The coating material flows down the substrate completely covering the front surface of the substrate. Excess coating material may drip from the bottom edge or be wicked away from bottom edge by capillary action onto a mechanism designed for that purpose. In some embodiments, excess coating material may be collected at the bottom of the substrate for reuse. The decision to reuse this material or not depends on the composition of the coating material and substrate. For example, if the coating material is quite stable and does not significantly change during the time it travels down the substrate and if the substrate does not contaminate the coating material then a decision might be made to reuse excess material collected from the bottom edge.

Next, optionally, there may be a pause of between 1 and 600 seconds after the dispensing of coating material has finished while excess coating material is able to drain out of the internal pocket and from the wet surface of the distribution blade onto the substrate. The length of this pause may be optimized to reduce the possibility of drips from the distribution blade after the substrate is removed from the coating head. In some embodiments, this pause may be long enough to allow the distribution blade and/or the top area of the substrate to dry or partially dry.

Next, the substrate may be withdrawn from the coating head. In some embodiments, if the coating head is still wet, a drip guard may quickly move into place between the substrate and the bottom edge of the distribution blade. This drip guard may optionally touch the bottom edge of the blade to wick away excess material in which case the surface of the drip guard may have similar surface characteristics to the front surface of the distribution blade to encourage the coating material to easily flow off the distribution blade.

Finally, the substrate may be allowed to dry in a manner that allows the coating material to undergo gelation such that a uniform high quality coating is formed on the substrate surface.

This coating method, enabled by the novel design of the coating head can have several of the following advantages over alternative coating techniques. First, by dispensing material simultaneously across the full width of the substrate the time to dispense can be greatly shortened. Second, by pre-wetting the substrate the amount of time for the coating material to flow down the substrate can be greatly shortened and the amount of coating material required to fully wet the substrate surface is greatly reduced. Third, if coating material is not collected at the bottom of the substrate for reuse then only fresh (virgin) material can be deposited on the substrate so control of coating material purity and composition can be greatly increased. Fourth, by utilizing a distribution blade in conjunction with a properly sized slot dispenser, the uniformity of flow of material on to the substrate can be greatly increased at very low cost and with a very simply system. Fifth, the technique can be very tolerant of deviation of flatness on the substrate without requiring any precision mechanical control or design. Sixth, the method does not necessarily pose any significant chemical compatibility challenges where it may be difficult to identify critical coating components with properties that are not sensitive to or contaminate the coating material. Finally, the method can be inherently single sided allowing the flexibility to coat one side of the substrate or both (in a second coating step) if needed.

It should also be understood that in some embodiments the formulation of the coating material will have a significant effect on the uniformity of the thin-film. In particular, in a sol-gel coating material the ratio of solids or particle content to solvent in conjunction with the ambient conditions during drying may affect the gelation process that occurs as the thin-film forms. Careful control of these elements will enhance the uniformity of the final thin-film especially in the top to bottom direction on the substrate.

Figure 7A:
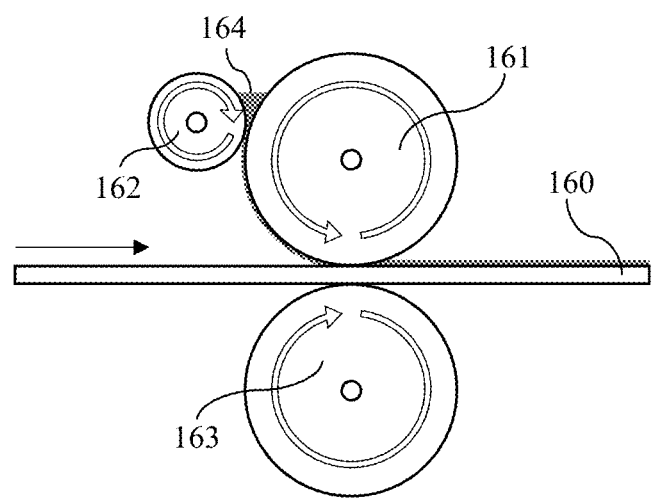
FIGS. 7a and 7b depict a roll-coat system optimized for coating on flat substrates.
Figure 7B:
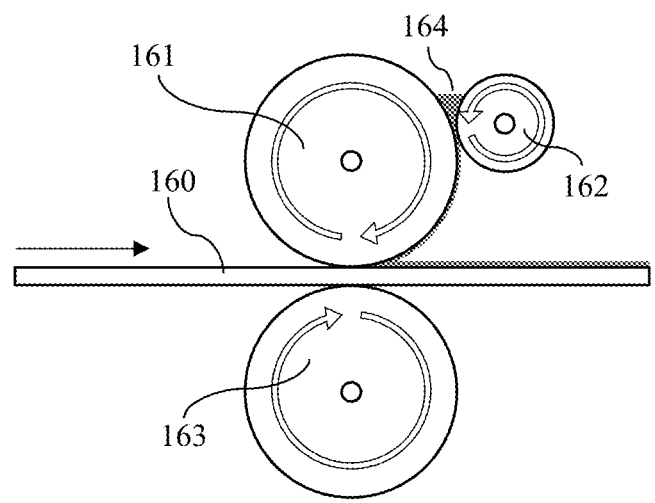

FIG. 7a shows a simplified schematic of a forward roll coating apparatus. FIG. 7b shows a simplified schematic of a reverse roll-coating apparatus. In both figures, a flat substrate (160) is fed from left to right. A counter pressure roller (163) supports the substrate from the bottom and moves in a complementary direction to the movement of the substrate. A coating material (164) is deposited in a reservoir created between a doctor roller (162) and an application roller (161). The pressure or spacing of the doctor roller to application roller controls the amount of coating material that is transferred to the application roller. The surfaces of the doctor and application rollers may be smooth or textured, soft or hard. The roller surfaces need not be the same. For example, the doctor roller may be compliant and textured while the application roller could be hard and smooth and vice versa. The application roller transfers coating material to the surface of the substrate. The pressure or distance between the application roller and the substrate surface is adjustable to facilitate control of the final wet-coating thickness and/or uniformity of the material on the substrate. In forward roll-coating, the application roller (161) moves in the same direction as the direction of motion of the substrate. In reverse roll-coating, the application roller (161) moves in the opposite direction to the motion of the substrate.

The substrate may be continuous, such as for example a roll of polymer sheet or steel, or it may be discontinuous, such as discrete pieces of glass or wood or individual solar panels. In the case of discontinuous substrates, the application roller assembly may be moved in a vertical direction such that it touches down on the leading edge of the substrate as it enters the roll-coater and then lifts off the trailing edge as the substrate exits the roll-coater. This technique may reduce uniformity on the leading and trailing edges.

Selection of the materials within the roll-coater that come into contact with the liquid coating material are a consideration. In some embodiments, the coating material may be corrosive, having either a high or low pH. In an embodiment, the pH of the coating material is between 1.8 and 2.8. Additionally, in some embodiments, the coating material contains organic solvents such as iso-propyl alcohol, methanol, ethanol, propylene glycol monomethyl ether, propylene glycol monomethyl ether acetate, and the like. All materials may be selected to withstand both the organic solvents and pH conditions used. For metallic components, stainless steel is preferential with chrome-plated steel, for example. In selecting polymer materials for pipes, fittings and seals made from polytetrafluoroethylene, polypropylene, polyether ether ketone, and polyvinylidene difluoride may be considered. For polymer coatings on the rollers polyurethane, EPDM (ethylene propylene diene monomer) rubber and nitrile rubber are suitable. The particular embodiment of a roll-coater selected for a specific sol-gel coating application depends upon a number of factors. The wet film thickness is a process parameter to consider in achieving the final cured film thickness. The desired wet thickness may be dependent on the desired final dry thickness, the solids content of the coating material and the target porosity of the final dry film. In one embodiment, the desired final thickness is 120 nm (DT), the solids content (SC) of the coating material is between 1% and 3% by volume and the target porosity (P) is 10%. The target wet thickness (WT) may be calculated with the following formula:

$$WT = \frac{DT}{SC*(1-P)}$$

Figure 8:
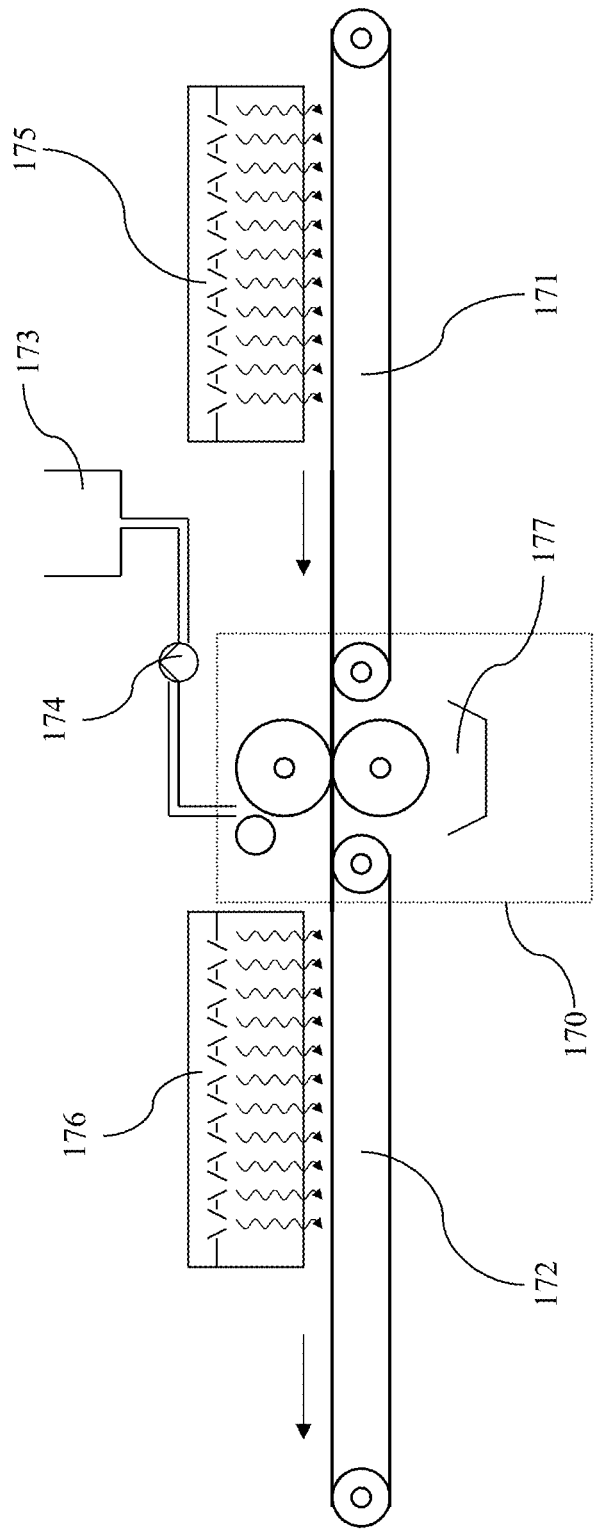
FIG. 8 depicts an embodiment of a roll-coat system for flat substrates.

For example, the equation yields a target wet thickness between approximately 4 μm and 14 μm using the input parameters above. Wet thickness can be controlled by a number of process controls on the roll-coater system. Selection of which parameters are most important is dependent upon the characteristics of the coating material, such as for example its viscosity, and the architecture or operation mode of the roll-coater, such as forward or reverse. Typically, the parameters adjusted are the doctor roller spacing and/or pressure to the application roller; the application roller spacing/pressure to the substrate; the speed at which the substrate moves and in the case of reverse roll-coating the difference in speed between the substrate and the application roller. The speed at which the doctor roller moves relative to the application roller is also a process parameter. FIG. 8 shows an embodiment of a roll-coater used for sol-gel coating of flat substrates such as glass or solar panels. The roll-coater (170) is positioned after a feed-in conveyor (171) and ahead of a feed-out conveyor (172). In FIG. 8, substrates move from right to left. Coating material (173) is fed to the roll-coater from a storage tank at a controlled rate by a pump (174). Excess material is collected (177) off the ends of the rollers and recirculated. An optional pre-heater (175) may be positioned such that it can heat the substrate prior to the roll-coater. The substrate may be heated to a temperature, such as a temperature between 2° C. and 80° C. In some embodiments, this pre-heat step can serve to reduce thermal stress during the very rapid heating of subsequent process step. In other embodiments, it is used to control evaporation rates of the coating material placed on the substrate to achieve specific process targets such as uniformity, film-thickness, porosity or process speed. Careful consideration should be paid regarding heat transfer from warmed substrates to the application roller such that it is accounted for in the process. In one embodiment, a flash-off heater (176) is positioned at the output of the roll-coater to control evaporation of the solvent of the coating material to facilitate the gelation of the thin-film. In some embodiments, the pre-heater and the flash-off heater may be radiant infrared or in other embodiments they may be electric or fuel fired convection heaters. In another embodiment forced air at ambient or close to ambient temperature could be used to accomplish the flash-off process by accelerating solvent evaporation.

The conveyor systems used to move substrates between process stages may be continuous belt driven systems. In some embodiments robots might be used to convey substrates between process stages. In other embodiment substrates might be conveyed by humans using carts. In any case it should be understood that substrates may be conveyed between process steps by many means known in the art.

An important consideration when using roll-coaters is accommodating or controlling for evaporation of coating material solvent from the equipment itself as the machine is running To mitigate this evaporation, it can be advantageous to add make-up solvent to the coating material such that the solids concentration is controlled within a workable range. Make-up solvent can be added at a constant rate known to match the steady-state rate of evaporation; it can be added periodically based on pre-determined intervals based on time, quantities of substrates coated, or coating material consumed. Make-up solvent can be added based on an active feedback loop wherein the solids concentration is measured directly or indirectly and then used to control the amount added. Solids concentration might be measured by optical means such as dynamic light scattering or adsorption or refractive index; it could be measured by physical properties such as for example density or viscosity; it could be measured chemically such as for example monitoring pH.

Sol-gel materials used for coatings are often sensitive to environmental conditions such as relative humidity and temperature during the gelation process. Additionally, sol-gel materials may release significant amounts of solvent vapor prior to or during cure. It is therefore desirable to engineer the environment around the roll-coating system such as that temperature and humidity are controlled, and solvent vapor is removed. In some embodiments a containment chamber is built around the complete roll-coater system with a dedicated HVAC unit to control temperature and relative humidity. In an embodiment, there is a secondary interior containment around the coater application roller and the flash-off area that is small in volume such that its temperature and relative humidity can be controlled more easily. This interior containment area is also used to collect solvent vapor for venting, destruction or recycling. This has an additional advantage to prevent people working inside the primary containment area from being subjected to elevated levels of solvent vapor. Such an environmental chamber system would have safety interlocks such that the tool could be stopped and any coating material safely contained if the solvent vapors approached flammability safety limits.

Figure 9:
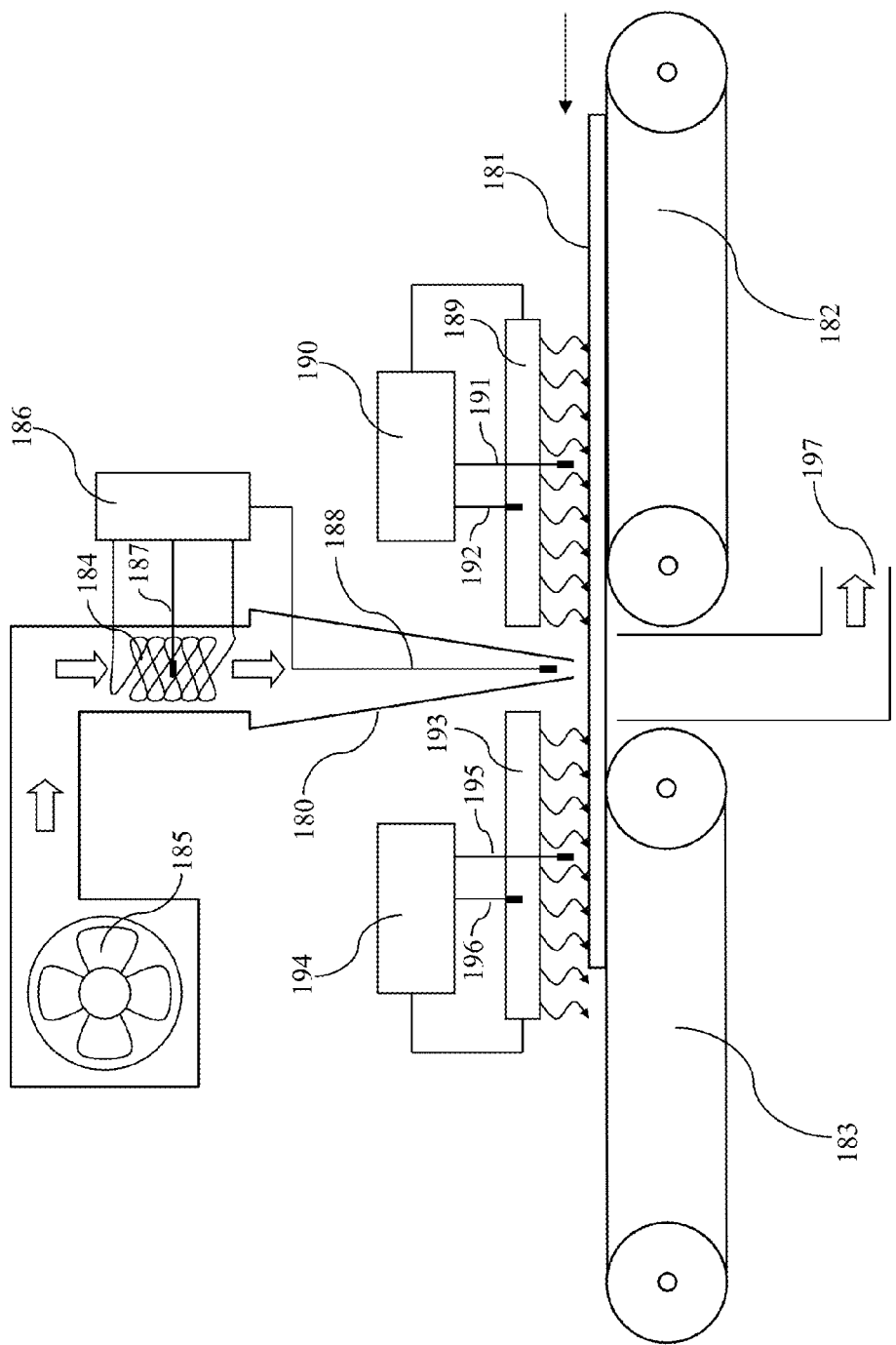
FIG. 9 depicts an embodiment of a skin-cure system.

FIG. 9 shows a cross-sectional schematic view of one embodiment of a curing apparatus and method for skin-cure. In this apparatus, an air-knife (180) directs heated air on to the surface of a substrate (181) presented to the air-knife by a feed-in conveyor (182) and extracted by a feed-out conveyor (183). The air may be heated by an electrical element (184), as shown in FIG. 9, may also be heated by any other method known in the art. The air may be heated to any temperature useful in the method, such as to a temperature of 300° C. to 1000° C. Air may be forced through the heating element and air-knife by a fan (185). The temperature of the air is controlled by an electronic controller (186) and temperature sensor (188) located in the heated air stream. Optionally, overheat protection of the heating element may be provided by the electronic controller and, optionally, a second temperature sensor (187) located close to the heating element. When no substrate is present, air may flow from the fan through the heating element, through the air-knife and then directly to the exhaust (197). When a substrate is present, the air flows along the top surface of the substrate. In an embodiment, a pre-heating stage (189), for example an infrared emitter, heats the substrate prior to the air-knife. The pre-heat temperature is controlled by an electronic controller (190) and a temperature sensor (191) with an optional safety over-heat sensor (192). In another embodiment a flat plate attached to the leading edge of the air-knife forms a pre-heat chamber (189) with the top surface of substrate. This pre-heat chamber traps the hot air close to the substrate surface for a longer period allowing the hot air more time to pre-heat the substrate surface. A post-heating stage (193), for example an infrared emitter (190), located subsequent to the air-knife provides additional heat that can extend the time that the substrate stays at an elevated temperature. The post-heating temperature is controlled by an electronic controller (194) and a temperature sensor (195), with an optional safety over-heat sensor (196). In another embodiment, there is a heating element in place of the pre-heat chamber. The pre-heating of the substrate can serve to reduce thermal stress during the very rapid heating under the air-knife and to provide an additional control on the peak temperature the substrate reaches under the air-knife, the peak temperature being a function of the initial temperature plus the temperature rise due to the air-knife.

A major advantage of this embodiment of a skin-cure system is that it allows the curing of a thin-film sol-gel coating without heating the entire substrate to a high temperature. A properly configured air-knife is able to heat the surface very fast (high power) without imparting a great deal of heat (energy) to the full substrate. Thus while the surface heats rapidly to a high temperature the overall substrate does not heat up excessively. In one embodiment the substrate is glass coated on one side with thin-film solar cells, and the opposing side of the glass is the desired surface for the sol coating. In this case, it is desirable to avoid heating and raising the temperature of the semiconductor photovoltaic material as much as possible while curing the sol coating. Thin-film solar materials such as CdTe, CIGS or amorphous silicon can be quite sensitive to elevated temperatures. High temperatures can cause dopants within the material to defuse in a detrimental manner or can cause metal electrode materials to defuse into the photovoltaic material. In some embodiments, the temperature of the photovoltaic cell may be kept from exceeding 100° C. to 120° C. as the sol is cured. Additionally, polymer materials within the finished solar panel such as encapsulates may be kept from exceeding their glass transition temperature of 150° C. to 200° C.

Figure 10:
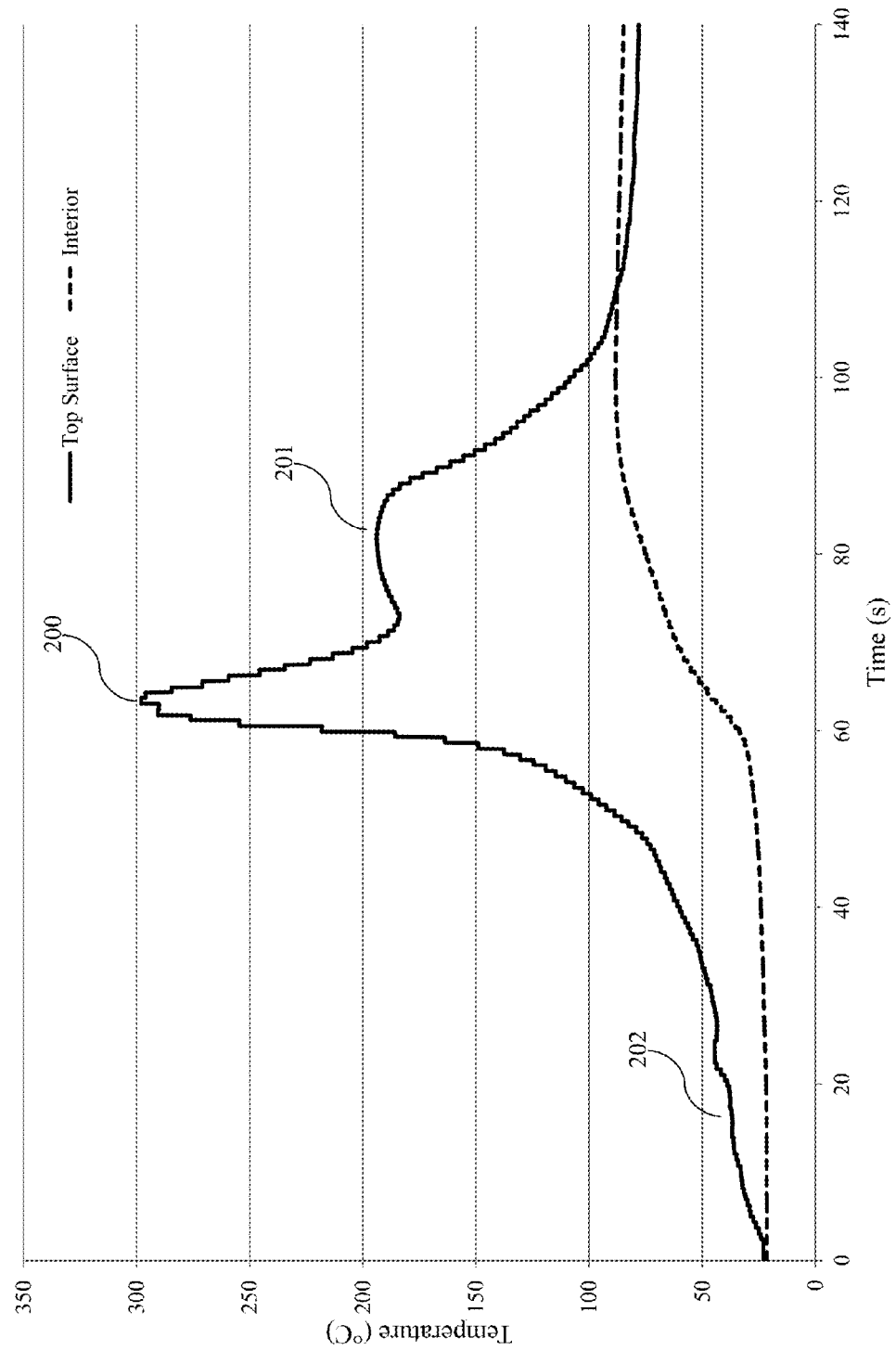
FIG. 10 depicts an example temperature profile for a skin-cure system.

FIG. 10 shows an example temperature profile for a skin-cure system. In this example the substrate is a dummy thin-film solar module consisting of two pieces of glass typical of those used in thin-film module manufacturing, laminated together with temperature sensors embedded between the glass sheets such that they measure the interior temperature of the dummy module and temperature sensors attached to the top surface. The module was moved at a speed of 1 cm/s under an air-knife set to an exit air temperature of approximately 650° C. and a gap distance (from substrate top surface to the air-knife opening) of approximately 1 cm. Two temperatures are shown, the top surface temperature representing the temperature reached by the interior of the dummy module. In this example the pre-heat chamber embodiment was used. From the profile, the pre-heat chamber caused an initial rise in temperature of the top surface (202) to approximately 100° C., there after the air-knife caused a very rapid temperature rise (200) to approximately 300° C. after which the post-heat infrared emitter set to a temperature of 300° C. as measured by a sensor placed between the substrate and the IR emitter, maintains the top surface temperature (201) at approximately 200° C. Through-out the process the interior temperature never exceeds approximately 90° C.

In one embodiment, the substrate is glass of thickness 1 mm to 4 mm. In an embodiment of a skin-cure apparatus, the air-temperature exiting the air knife is between 500° C. to 750° C. as controlled by the power setting of the heating element and the volume of air provided by the fan. The speed of the substrate is between 0.25 cm/s and 3.5 cm/s. The resulting temperature of the substrate surface is between 150° C. to 600° C. and this temperature is attained between the start of the pre-heat chamber and the end of the air-knife. In other embodiments the substrate is pre-heated by an infrared emitter to approximately 25° C. to 200° C. prior to the air-knife wherein it is further heated to approximately 150° C. to 600° C. Thereafter, the substrate is maintained at a temperature of between 120° C. to 400° C. until the end of the post-heat section. Such a configuration of the skin-cure apparatus has been shown to cure the sol coating while leaving the opposing surface at a temperature below 120° C.

The process of rapidly heating the substrate using the air-knife and then maintaining that temperature with radiant heat facilitates the curing of the sol-gel material. In an embodiment, the curing is achieved by providing sufficient energy so that a sufficient portion of the remaining Si—OH moieties within the coating undergo a condensation reaction and form Si—O—Si crosslinks that greatly strengthen the material enabling it to pass Taber abrasion testing to standard EN-1096-2 with no more than 0.5% loss of absolute transmission. In other embodiments, the curing temperature is used to facilitate other processes such as volatizing a sacrificial component of the coating to form a desired porosity or a desired surface morphology. Other embodiments may use very high temperatures to completely oxidize all organic components in the coating creating a hydrophilic pure silica film. Yet further embodiments may use the heat and/or reactive gas composition of the air-knife to initiate chemical reactions that modify the properties of the coating, such as for example, surface energy, color, refractive index, surface morphology and surface chemistry. In embodiments, the skin-cure process works in concert with the composition and properties of the coating material to facilitate tuning of the properties of the final thin-film coating.

Figure 11:
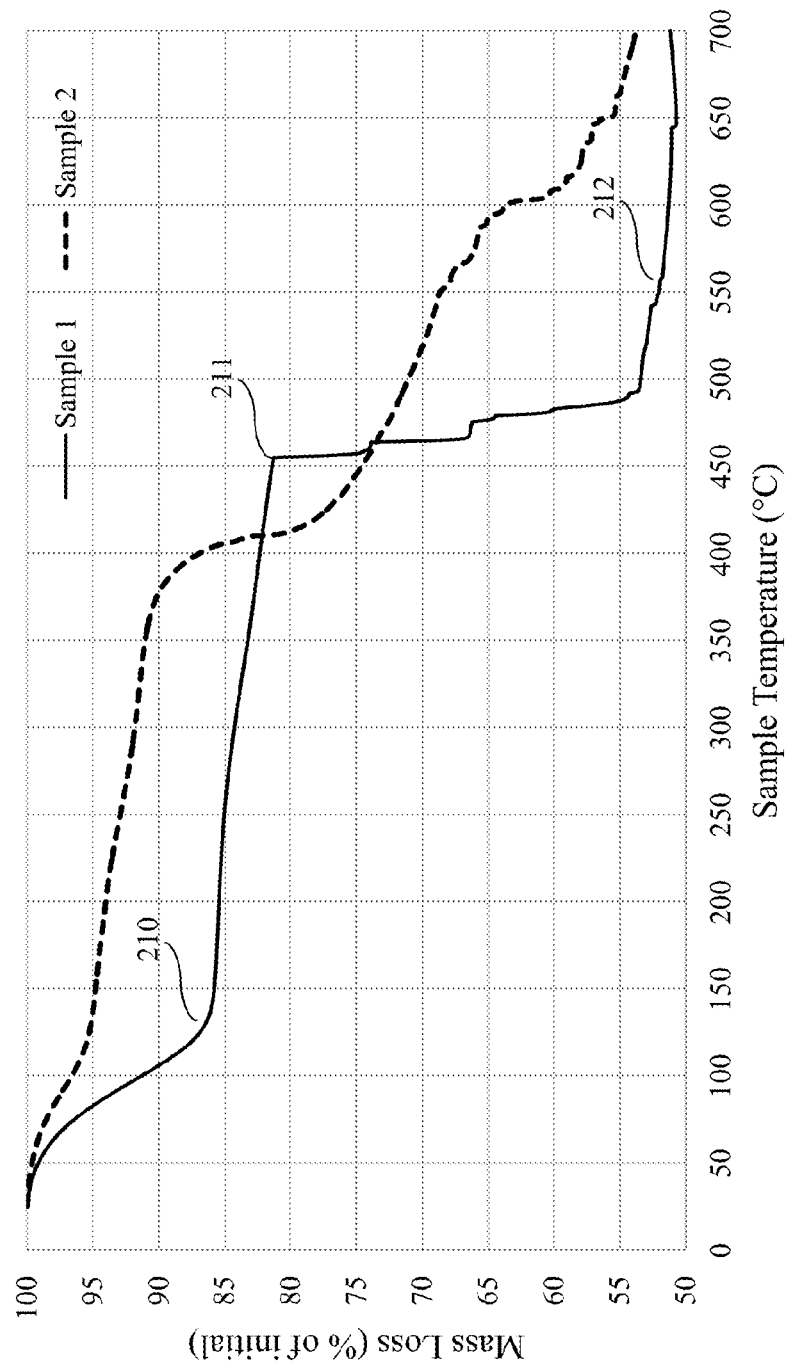
FIG. 11 depicts an example of thermogravimetric analysis of representative samples of coating material.

FIG. 11 shows a thermogravimetric analysis of representative samples of coating material. Thermogravimetric analysis is performed by heating a sample gradually and recording the loss of mass as various components of the sample volatize. When performed on coating materials such as these example sol-gel coatings for glass, it can be used to determine critical temperatures required to cure the coating material. The figure shows three temperatures of interest. Using Sample 1 in FIG. 11 as an illustrative example, there is a point of inflection (210) at approximately 125° C., another much steeper point of inflection (211) at approximately 450° C. finally there is a flattening out (212) above 500° C. Without being bound by theory, these three points are interpreted as follows. As temperature increases to point 210 any residual water and solvent is volatilized and all easily accessible Si—OH moieties react and release water. This represents a substantially cured film that has attained a useful hardness and abrasion resistance at a relatively low temperature. Further heating in the range from point 210 until point 211 represents an approximately linear reduction in mass as additional remaining Si—OH moieties condense and release water. This temperature range represents increasing hardness and abrasion resistance of the material with increasing temperature, without detrimental effects on the coating. This reduction in mass causes a corresponding decrease in density and hence a decrease in refractive index. In coating materials that form hydrophobic films, the reduction in Si—OH will also result in an increase of the hydrophobic effect as measured by increasing water contact angle. Heating beyond point 211 begins to oxidize organic moieties within the coating, the byproducts of which may then volatilize. In some embodiments these moieties may be methyl groups or other hydro-carbon groups or fluoro-carbon chains or any combination thereof. Other reactions may also occur such as for example the formation of SiC and SiOC. This temperature regime may be generalized as the oxidation of the organic components of the coating, reactions between byproducts of that oxidation with each other and with components of the film itself and the transformation of the coating to a substantially inorganic silica coating. At this point further heating no longer causes significant mass loss and the curve flattens out as indicated by point 212. Sample 2 is a different sol-gel coating material for glass, however, it also exhibits approximately the same shape and inflection points as Sample 1. It also illustrates that when more complex organic moieties are present in the coating the transformation that occurs after the second inflection point can be more complex and more prolonged. Therefore for the purposes of developing a process for curing these coatings we can determine from this analysis that a first low temperature cure can be accomplished at a temperature of approximately 125° C., that is the first point of inflection. A second higher temperature cure at the second point of inflection (approximately 450° C. for the material in Sample 1 and 350° C. for the material in Sample 2) results in increased hardness, abrasion resistance and hydrophobicity. Temperatures beyond the second inflection point result in the breakdown and modification of organic moieties that may in some embodiments be useful.

The curing process parameters including substrate speed, air knife output air temperature, air knife air flow volume, air knife opening distance to substrate surface, pre and post heating set temperatures are used to control process cure parameters including maximum temperature, rate of heating, duration at temperature, cumulative temperature exposure and rate of cooling that can be used to tune specific properties of the final cured film. One property is hardness as measured by nanoindentation methods. In some embodiments, the curing system described herein may cure sol-gel coatings on glass substrates to a hardness of approximately 0.2 GPa to 10 GPa and preferably to a hardness of approximately 2 GPa to 4 GPa. Another property is abrasion resistance. In some embodiments, the curing system described herein may cure sol-gel coatings on glass substrates to an abrasion resistance whereby they lose no more than 1% of absolute optical transmission as measured by spectrophotometer after 500 strokes of an abrasion test performed in accordance with specification EN1096-2 and preferably no more than 0.5% loss of absolute optical transmission after 1000 strokes. Such a test can be performed using a Taber reciprocating abrader model 5900 with a ratcheting arm assembly. A third property is surface energy as measured by water contact angle (WCA). In some embodiments the curing system described herein may cure sol-gel coatings to a WCA of approximately 60° to 120° and preferably to a WCA of approximately 70° to 100°. In other embodiments the film can be cured to a WCA of approximately 5° to 30° and preferably a WCA of approximately 10° to 20°. A fourth property is refractive index (RI) as measured by ellipsometer. In some embodiments curing system described herein may cure sol-gel coatings to a RI of approximately 1.25 to 1.45 and preferably a RI of approximately 1.35 to 1.42. A fifth property is final film thickness as measured by ellipsometer. The final film thickness is a function of the initial (pre-cure) dry film thickness and the cure parameters such that the cure parameters modify the initial dry thickness. In some embodiments the curing system described herein may cure sol-gel coatings to a thickness of 50 nm to 150 nm and to a preferred thickness of 70 nm to 130 nm.

Figures 12A, 12B, 12C:
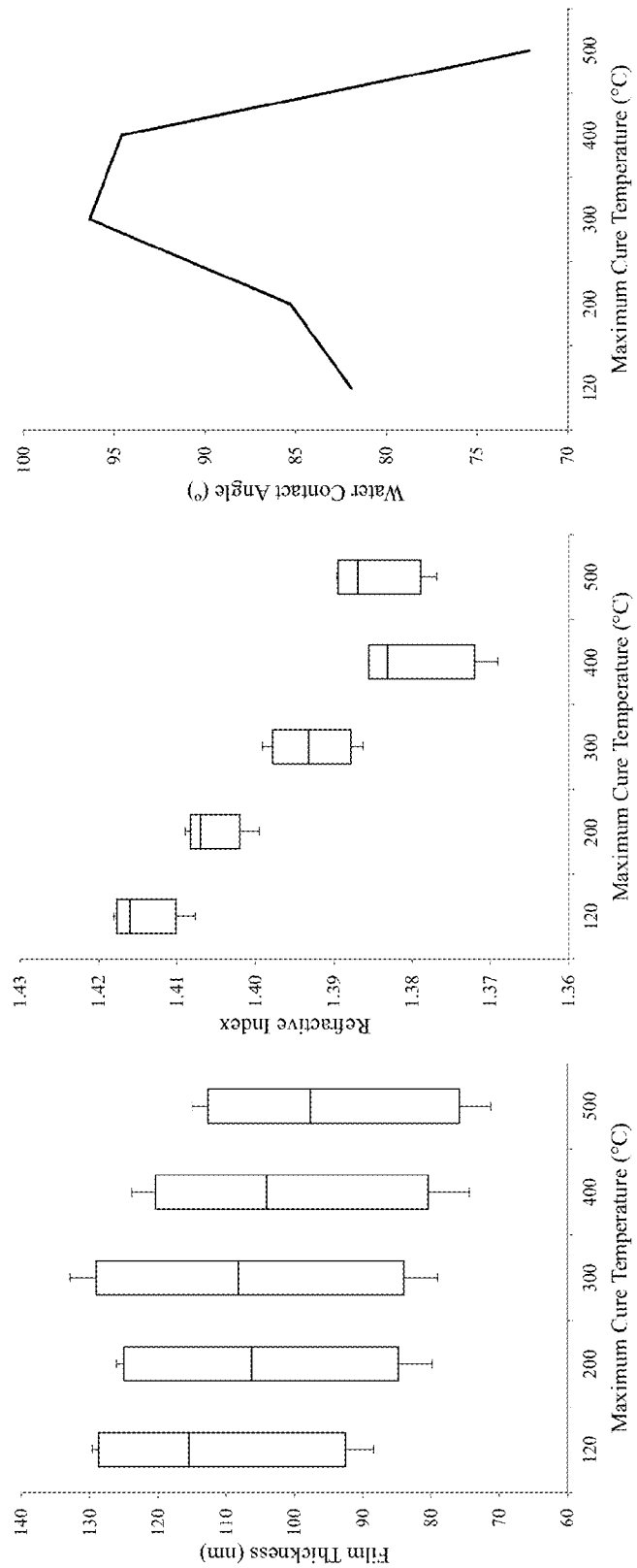
FIG. 12a, FIG. 12b and FIG. 12c show data for an exemplary sol-gel coating that demonstrate control of final film thickness, refractive index and water contact angle as a function of maximum cure temperature.

FIG. 12a, FIG. 12b and FIG. 12c depict data for an exemplary sol-gel coating that demonstrate control of final film thickness, refractive index and water contact angle as a function of maximum cure temperature.

Figure 13:
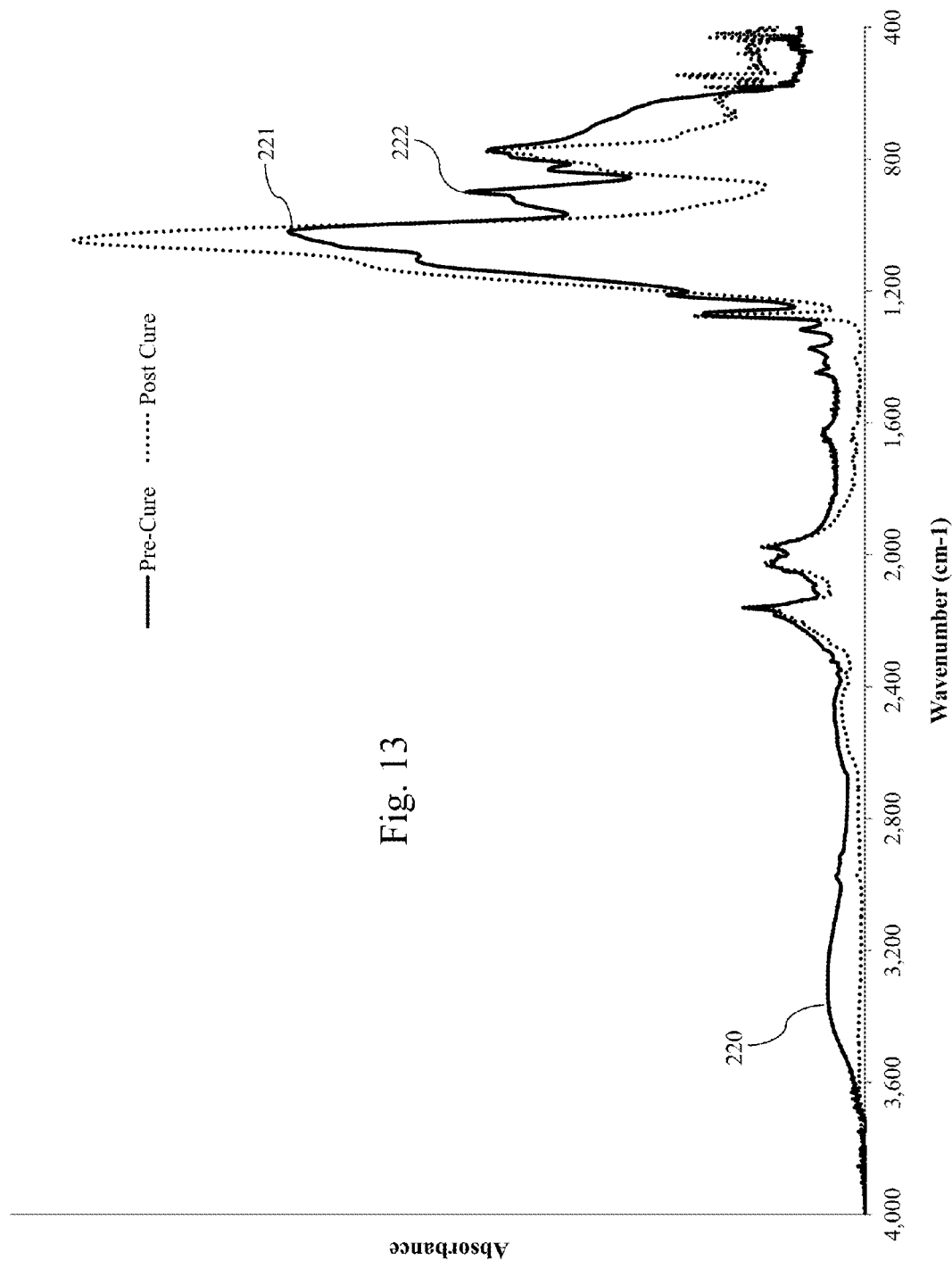
FIG. 13 depicts an example of FT-IR analysis of representative samples of coating material before and after the curing process.

FIG. 13 shows Fourier transform infrared spectroscopy data for an exemplary sol-gel coating material taken before and after a cure process step. This analysis technique shows how chemical bonds within the material change during the curing process. In particular the spectral peaks denoted by points 220, 221 & 222 have changed during the process. Without being bound by theory, these changes can be interpreted as the reduction of Si—OH bonds through condensation causing the reduction of the peaks at points 220 and 222. These bonds are converted to Si—O—Si bonds causing the increase in the peak at point 221. This analysis technique can be used to quantify the proportion of Si—OH bonds that condense and hence to quantify the degree to which the film is cured.

The coating and curing process steps may further be configured in to create coatings of varying complexity and structure. In embodiments, any combination of coating technique and curing technique may be used to achieve a final coating for a substrate. Embodiments of such combinations may include coating via a flow coating technique followed by a skin cure process or cure by conventional means, coating via a roll coating technique followed by a skin cure process or cure by conventional means, and the like. To generate multi-layer coatings, any combination of coating and curing apparatus may be used sequentially to generate such a coating. The sequential use of such apparatus may be enabled by an arrangement that places multiple coating apparatus and curing apparatus in sequence. Alternatively, handling facilities may exist for handling the substrate between one or more coating and curing apparatus. For example, two roll-coaters may be placed in sequence with an optional flash-off heater in between. This facilitates coating of a first layer by the first roll-coater, drying of the layer by the flash-off station, then deposition of a second layer by the second roll-coater before curing in a skin-cure station or in a simple oven. Alternatively, a high temperature skin-cure step may be interposed between the roll-coaters to enable a high temperature heat treatment to the first layer before application of the second layer. It is understood that this technique for multiple layer coatings may be extended to more than two layers. Multi-layer coatings manufactured by this technique may be high performance anti-reflective interference type coatings or multiple layers coatings could be used to modify the surface energy of the top surface coating by for example adding a fluorinated silane mono-layer to an underlying layer to make the final coating hydrophobic and oleophobic on the environmentally exposed surface. The multi-layer coatings may be used to enhance single layer anti-reflective coatings by adding a lower refractive index material on the environmentally exposed surface to create a graded index coating between the environment and the underlying substrate.

Figure 14:
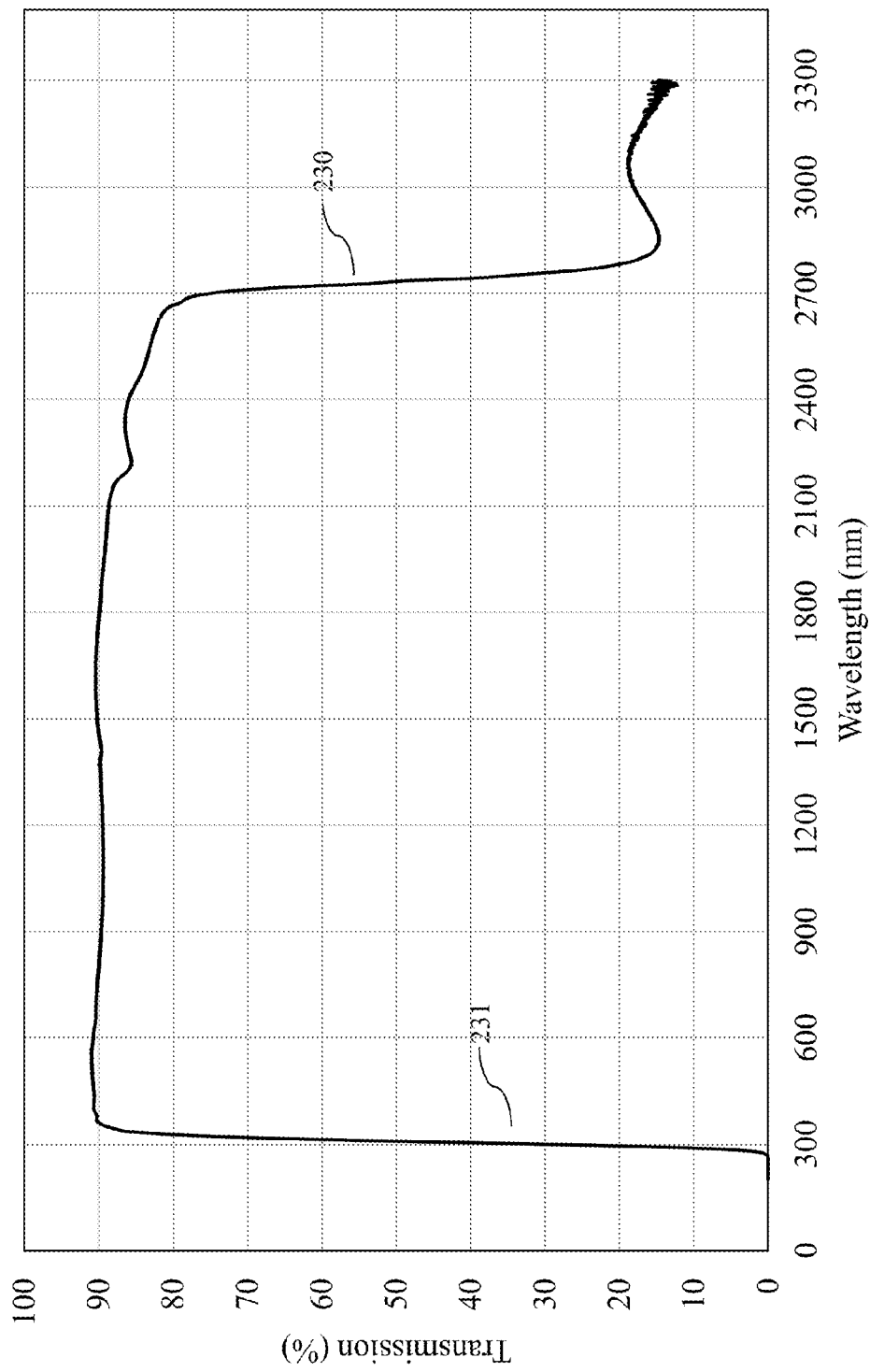
FIG. 14 depicts an example transmission spectrum of low-iron soda-lime glass from UV through to mid-range infrared wavelengths.

FIG. 14 shows a transmission spectrum of a sample of low-iron soda-lime glass over the range of 200-3300 nm. It shows that the glass is strongly absorbing below wavelengths of about 300 nm (231) and above wavelengths of about 2700 nm (230). In between these wavelengths the glass is generally low-absorbing and transparent, transmitting about 80-90% of incident photons. In order to heat glass with radiant energy efficiently and quickly, the glass must absorb a significant portion of the emitted energy. FIG. 14 shows that a suitable emitter source for heating glass should have significant energy at wavelengths greater than about 2700 nm or less than about 300 nm. Wien's Displacement Law can be used to determine the required temperature of a blackbody emitter to have peak emission at a given wavelength.

$$\lambda_{peak} = \frac{2.8978 \times 10^6 \text{ nm} \cdot K}{T}$$

Using this equation, a blackbody emitter with a temperature of about 800° C. is calculated to have a peak emission at a wavelength of 2700 nm. Accordingly, an optimal temperature range for an infrared emitter for heating low-iron soda-lime glass may be below 800° C. A blackbody emitter is not practical for peak emissions in the UV range below 300 nm and hence other types of emitters should be used.

Figure 15:
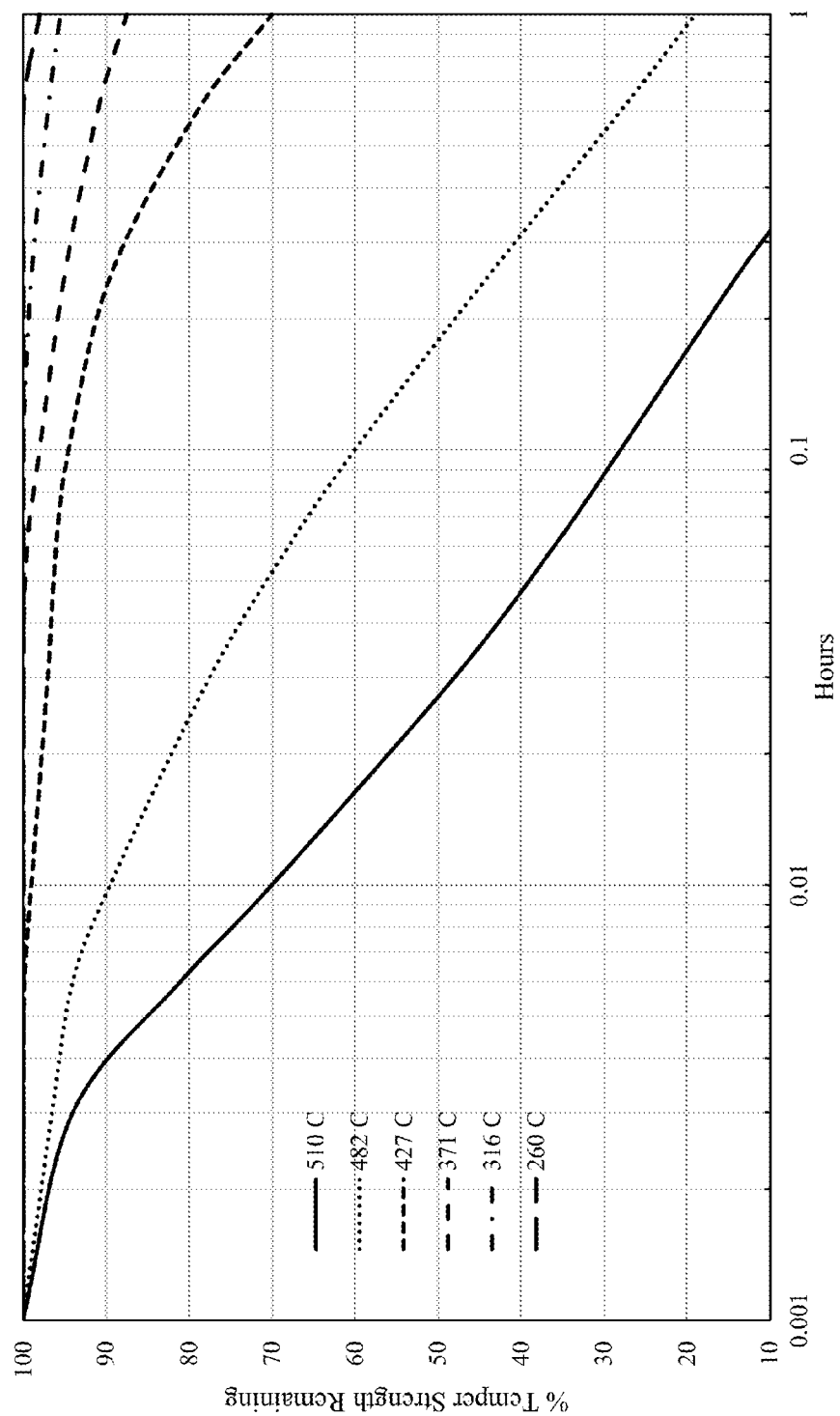
FIG. 15 depicts the response in terms of loss of temper strength of tempered glass to heating at a range of temperatures and durations.

FIG. 15 shows the percentage of temper strength remaining as tempered glass is heated. Tempered glass gets its strength from compressive stress locked into the surface by the tempering heat treatment process. Subsequent heating of the glass can relax that stress and so reduce the strength. Accordingly, any post-tempering heat treatment such as curing of a sol-gel coating must take into account the time-temperature exposure effect on the glass temper strength. In FIG. 15, it can be seen that at a temperature of 510° C., the temper strength is rapidly lost, falling below 90% in just 0.003 hours (~10 seconds). However at a temperature of 371° C., there is no discernable effect until about 0.04 hours (~144 seconds). As a matter of practicality, glass cannot be heated instantaneously and one must account for the total time to heat-up and cool-down the glass, therefore as a safety factor a maximum temperature of 300° C. can be used for cure times of less than 1 hour without adversely affecting the temper strength. However if far more rapid curing times can be achieved, then higher peak temperatures may be attainable. For example, for a cure time of less than 0.05 hours (180 seconds), a temperature as high as 371° C. could be used without significantly affecting temper strength. Given that the final strength and performance of sol-gel coatings increases with the maximum temperature reached during the cure process, the ability of a cure facility to rapidly reach high temperatures enables performance not attainable with slower or lower temperature cure equipment. FIG. 15 shows that in the case of a substrate composed of tempered glass, a rapid cure process must attain peak temperatures in less than about 180 seconds, and preferably, less than about 60 seconds.

Figure 16:
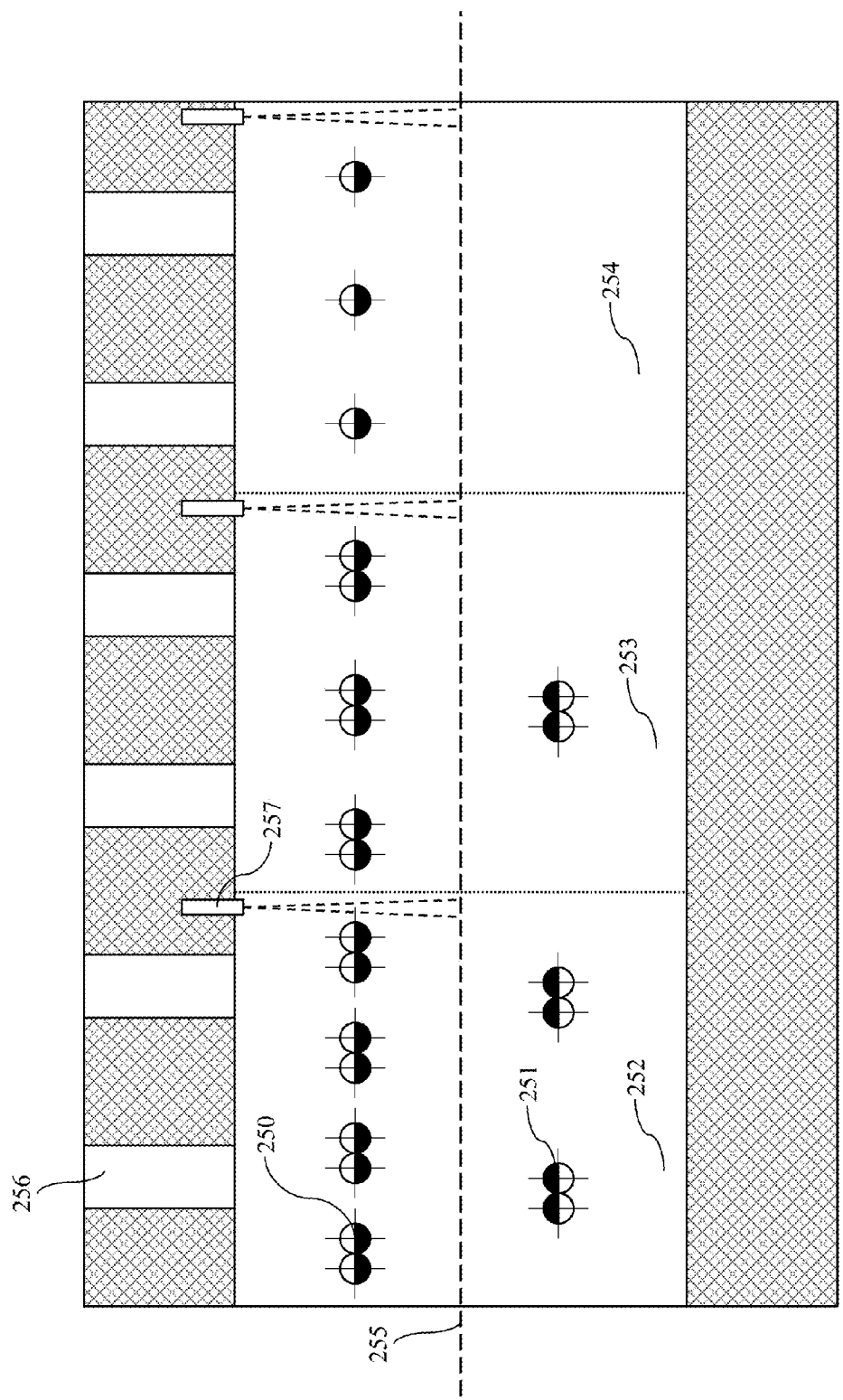
FIG. 16 depicts an infrared emitter cure facility with heat-up, dwell and cool-down stages.

FIG. 16 shows a schematic cross-sectional view of an infrared cure facility with three zones: a heat-up zone (252), a dwell zone (253), and a cool-off zone (254). In an embodiment, infrared radiation is emitted by a plurality of gas-fired infrared emitters (250) disposed either or both of above and below a conveyor track (255) that transports a substantially flat substrate through the cure facility, such as from left to right in this example. In some embodiments, the sol-gel coated surface of the substantially flat substrate may be facing upwards towards the majority of the infrared emitters as it is conveyed through the cure facility. Exhaust vents (256) remove excess heat and combustion by-products. In some embodiments, the conveyor track (255) is composed of stainless steel. In other embodiments, ceramic rollers may be used for the conveyor (255) to facilitate higher working temperatures. In some embodiments, the gas-fired infrared emitters (250) may be in the form of a pipe and are supplied with pre-mixed air/fuel gas that is combusted within a slot cut down the length of the pipe. In some embodiments, the slot contains a metal mesh that controls the combustion. The fuel combustion heats the metal mesh and surrounding pipe to working temperatures between about 600° C. and about 1300° C., which accordingly emits infrared radiation. The gas-fired infrared emitter slot and mesh are disposed such that the emitted infrared radiation is directed towards the surface of the substantially flat substrate. In other embodiments, gas-fired infrared emitters may be used that are porous flat plates composed of refractory materials such as ceramic, engineered ceramic gas burners, or the like.

In some embodiments control of this heating may be accomplished by use of pyrometers (257) that measure the surface temperature of the substantially flat substrate. The output of the pyrometer may be used to provide feedback to an electronic control circuit such as for example a PID controller or the like. The electronic control circuit may control the output power of the infrared emitters by varying the amount of fuel or fuel mixture or the electrical current or voltage. In some embodiments additional sensors such as for example pyrometers or thermocouples or the like may be used to measure the temperature of the infrared emitters for the purpose of preventing them exceeding a maximum set point temperature.

In some embodiments, electric powered infrared heating elements are used instead of gas-fired pipe burners. Electrical heating elements such as the RAYMAX line of panel heaters supplied by Watlow Corporation or the like are well suited to the application.

When a substantially flat substrate enters the cure facility heat-up zone (252), a maximal number of infrared emitters may heat it as rapidly as possible. It then passes into a dwell zone (253) where a fewer number of emitters approximately balance the heat loss of the substantially flat substrate to maintain its temperature approximately constant. Lastly, it enters a cool-off zone where an even fewer number of emitters are present, allowing its temperature to fall.

In embodiments that use an infrared emitter the primary method of heating the substantially flat substrate is through absorption of infrared radiation in the bulk of the substantially flat substrate. If the bulk material of the substantially flat substrate has a large absorption coefficient, for example greater than 0.5 in the wavelength range of the infrared emitter, then very rapid heating of the substantially flat substrate can be achieved.

Figure 17:
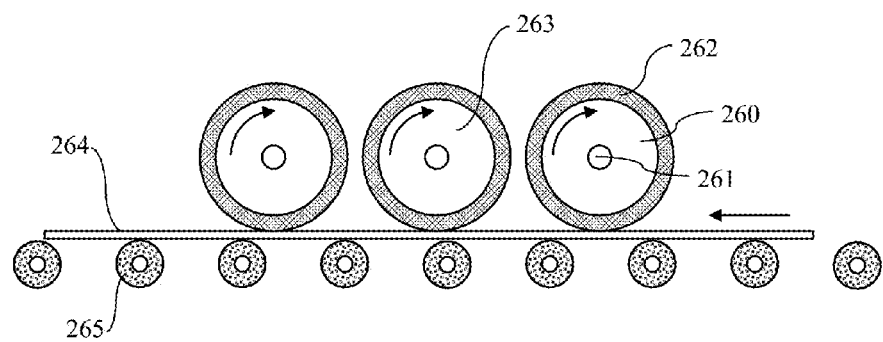
FIG. 17 depicts a cross-sectional schematic view of a heat applicator comprised of one or more heated rollers.

FIG. 17 shows a schematic cross-sectional view of a cure facility including at least one heat applicator roller (260) used to heat the surface of a substantially flat substrate (264) by direct conduction. The substantially flat substrate is conveyed under the heat applicator rollers (260) by a set of conveyor rollers (265). The heat applicator roller (260) has at least one inner cavity (261) in which at least one heating element may be installed. In some embodiments hot liquids or gases are transported through one or more cavities (261) to heat the roller. The outer surface of the roller may have an optional coating (262). The coating may perform at least one of the following functions: 1) a compliant layer between the roller and the substantially flat substrate to increase contact surface area and increase heat conduction; 2) an anti-corrosion or anti-oxidation layer to protect the material comprising the roller and; 3) an anti-wear coating to reduce wear of the roller. In some embodiments, additional heat applicator rollers (263) are used to increase the heating of the substantially flat substrate surface by successive applications of heat to the surface as it passes under successive heat applicator rollers. In some embodiments, the rollers comprise a metal such as iron, stainless steel, steel, aluminum, copper or the like. In some embodiments, the rollers comprise a ceramic or refractory material or the roller may be a composite of metal, ceramic and polymer materials. The optional coating may be a metal material such as chrome, tin, titanium or the like, or a polymer material such as a silicone plastic, rubber, Teflon-like material, or the like.

Figure 18:
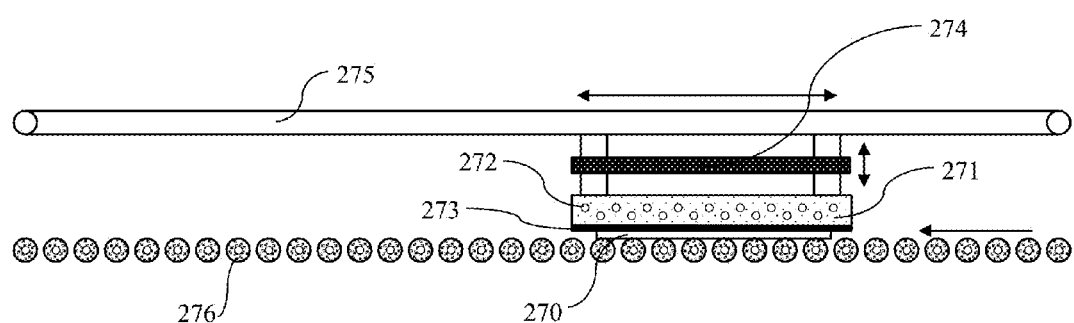
FIG. 18 depicts a cross-sectional schematic view of a heat applicator comprised of a flat plate.

FIG. 18 shows a schematic cross-sectional view of a cure facility including a heat applicator plate (271) used to heat the surface of a substantially flat substrate (270) by direct heat conduction. The substantially flat substrate (270) is conveyed by a conveyor system (276) to a point under the heat applicator plate (271). In some embodiments hot liquids or gases are transported through one or more cavities (272) to heat the plate. In some embodiments electrical elements are installed in one or more cavities (272) to heat the plate. The surface of the heat applicator plate may have an optional coating (273). The coating (273) may perform at least one of the following functions: 1) a compliant layer between the plate and the substantially flat substrate to increase surface area and increase heat conduction; 2) an anti-corrosion or anti-oxidation layer to protect the material of the plate and; 3) an anti-wear coating to reduce wear of the plate. In some embodiments, the heat applicator plate is moved into contact with the substantially flat substrate using a mechanism (274), such as a lift or lever, and then remains stationary for a period of time during which the surface of the substantially flat substrate is heated, after which it is moved out of contact using the same mechanism. In some embodiments, the heat applicator plate moves into contact with the substantially flat substrate and thereafter moves with the substantially flat substrate for a period of time before being moved out of contact. A conveyor mechanism (275) moves the heat applicator plate in a horizontal direction while it is in contact with the substantially flat substrate and also moves it back to an initial position after it moves out of contact with the substantially flat substrate to an initial starting point to begin the next curing cycle with a new substantially flat substrate. In some embodiments, the plate comprises a metal, such as iron, stainless steel, steel, aluminum, copper or the like. In some embodiments, the plate comprises a ceramic or refractory material or the plate may be a composite of metal, ceramic and polymer materials. The optional coating may be a metal material such as chrome, tin, titanium or the like, or a polymer material such as a silicone plastic, rubber, a fluro-polymer material or the like. In some embodiments, the plate does not directly contact the substantially flat substrate, but is held at a close distance apart to facilitate conduction through a thin layer of air. The distance between the heat applicator plate and the surface of the substantially flat substrate may be between about 0 mm and about 10 mm, or between about 0 mm and about 2 mm.

The foregoing apparatus and methods are particularly well suited to the application of sol-gel thin-films to glass. In an embodiment, the glass to be coated is the front (sun facing) surface of a solar panel and the sol-gel thin-film is an anti-reflective coating. Either bare glass may be coated and/or cured by the apparatus or fully assembled solar panels or solar panels at any intermediate stage of manufacture. In other embodiments, the apparatus may be used to coat and/or cure windows, architectural glass, displays, lenses, mirrors or other electronic devices.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platform. A processor may be any kind of computational or processing device capable of executing program instructions, codes, binary instructions and the like. The processor may be or may include a signal processor, digital processor, embedded processor, microprocessor or any variant such as a co-processor (math co-processor, graphic co-processor, communication co-processor and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more thread. The thread may spawn other threads that may have assigned priorities associated with them; the processor may execute these threads based on priority or any other order based on instructions provided in the program code. The processor, or any machine utilizing one, may include memory that stores methods, codes, instructions and programs as described herein and elsewhere. The processor may access a storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache and the like.

A processor may include one or more cores that may enhance speed and performance of a multiprocessor. In embodiments, the process may be a dual core processor, quad core processors, other chip-level multiprocessor and the like that combine two or more independent cores (called a die).

The methods and systems described herein may be deployed in part or in whole through a machine that executes computer software on a server, client, firewall, gateway, hub, router, or other such computer and/or networking hardware. The software program may be associated with a server that may include a file server, print server, domain server, internet server, intranet server, cloud server, and other variants such as secondary server, host server, distributed server and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of program across the network. The networking of some or all of these devices may facilitate parallel processing of a program or method at one or more location without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network having multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, EVDO, mesh, or other networks types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic books readers, music players and the like. These devices may include, apart from other components, a storage medium such as a flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g. USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, and the like.

The methods and systems described herein may transform physical and/or or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable media having a processor capable of executing program instructions stored thereon as a monolithic software structure, as standalone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices having artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable device, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions.

Thus, in one aspect, methods described above and combinations thereof may be embodied in computer executable code that, when executing on one or more computing devices, performs the steps thereof. In another aspect, the methods may be embodied in systems that perform the steps thereof, and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

Embodiments described herein are well suited to performing various other steps or variations of the steps recited herein, and in a sequence other than that depicted and/or described herein.

It should be appreciated that reference throughout this specification to "one embodiment" or "an embodiment" means that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the disclosure.

Similarly, it should be appreciated that in the foregoing description of exemplary embodiments of the disclosure, various features of the disclosure are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. No language in the specification should be construed as indicating any non-claimed element as essential to the practice of the disclosure.

While the foregoing written description enables one of ordinary skill to make and use what is considered presently to be the best mode thereof, those of ordinary skill will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

All documents referenced herein are hereby incorporated by reference.

What is claimed is:

1. A solar panel glass coating and curing apparatus configured to coat sol-gel on solar panel glass, comprising:
   a combination roll coating and curing facility, comprising:
      a first conveyor system adapted to transport a flat substrate,
      at least one roll coating facility adapted to receive the flat substrate from the first conveyor system, the at least one roll coating facility comprising a doctor roller and an application roller;
      a second conveyor system adapted to receive the flat substrate from the at least one roll coating facility, wherein the second conveyor system is adapted to transport the flat substrate to at least one curing facility and wherein the substrate remains flat when it is transported by the first conveyor system and the second conveyor system;
   a source of a sol-gel coating for use in the combination roll coating and curing facility, the source comprising space for a reservoir of the sol-gel coating material between the doctor roller and the application roller of the at least one roll coating facility, the reservoir in fluid communication with the doctor roller and the application roller;
   a processor that controls a process parameter of the at least one roll coating facility; and
   at least one infrared emitter of the at least one curing facility, wherein the at least one infrared emitter is adapted to direct radiation to a portion of the flat substrate as it is transported through the at least one curing facility,
   wherein the at least one roll coating facility is adapted to coat the flat substrate with a continuous film of sol-gel coating material and wherein the at least one infrared emitter is adapted to cure the continuous sol-gel coating material.

2. The apparatus of claim 1, wherein the first conveyor system and the second conveyor system are configured for coating the front glass of a solar module.

3. The apparatus of claim 1, wherein the first conveyor system and the second conveyor system are configured for coating glass.

4. The apparatus of claim 1, wherein the at least one infrared emitter is heated to a temperature between 300° C. and 1300° C.

5. The apparatus of claim 1, wherein the at least one infrared emitter outputs an energy flux of between 1 W/cm$^2$ and 10 W/cm$^2$.

6. The apparatus of claim 1, wherein the at least one infrared emitter has a peak emission wavelength between 2 µm and 5 µm.

7. The apparatus of claim 1, wherein the conveyor system conveys the flat substrate at a speed between 3 cm/s and 20 cm/s.

8. The apparatus of claim 1, wherein the curing facility is configured to heat a surface of the flat substrate to between 200° C. and 350° C.

9. The apparatus of claim 1, wherein the flat substrate is heated within the curing facility for between 10 seconds and 120 seconds.

10. The apparatus of claim 1, wherein the at least one infrared emitter is heated by combustion of a pre-mixed air/fuel gas.

11. The apparatus of claim 1, wherein the at least one infrared emitter is a pipe burner.

12. The apparatus of claim 1, wherein the at least one infrared emitter is a porous refractory plate.

13. The apparatus of claim 1, wherein the at least one infrared emitter is an electrical element.

14. The apparatus of claim 1, wherein the output power of at least one infrared emitter is controlled by an electronic circuit by means of feedback from a sensor that measures the surface temperature of the flat substrate.

15. The apparatus of claim 14, wherein the sensor is a pyrometer.

16. The apparatus of claim 1, wherein the curing facility comprises a plurality of infrared emitters disposed to direct radiation at the flat substrate.

17. The apparatus of claim 16, wherein the plurality of infrared emitters are disposed to direct radiation to both top and bottom surfaces of the flat substrate.

18. The apparatus of claim 1, wherein the curing facility has one or more zones distinguished by differing heating capacities.

19. The apparatus of claim 1, wherein the curing facility has a heat-up zone that heats up the flat substrate, a dwell zone that maintains a temperature of a hot flat substrate, and a cool-down zone that allows for lowering the temperature of the hot flat substrate.

20. The apparatus of claim 1, wherein a plurality of roll coating facilities and curing facilities are arranged sequentially.

21. The apparatus of claim 1, wherein the processor comprises a computational or processing device programmed to execute computer program instructions.

* * * * *